United States Patent [19]
Zuniga et al.

[11] Patent Number: 5,762,544
[45] Date of Patent: Jun. 9, 1998

[54] CARRIER HEAD DESIGN FOR A CHEMICAL MECHANICAL POLISHING APPARATUS

[75] Inventors: Steven M. Zuniga, Santa Clara; Stephen J. Blumenkranz, Redwood City, both of Calif.

[73] Assignee: Applied Materials, Inc., Santa Clara, Calif.

[21] Appl. No.: 637,208

[22] Filed: Apr. 24, 1996

[51] Int. Cl.$^6$ ............................. B24B 5/00; B24B 29/00
[52] U.S. Cl. ............................. 451/285; 451/289
[58] Field of Search ........................... 451/285, 287, 451/288, 36, 398, 286, 289, 41

[56] References Cited

U.S. PATENT DOCUMENTS

| | | | |
|---|---|---|---|
| 3,559,346 | 2/1971 | Paola | 51/57 |
| 3,731,435 | 5/1973 | Boettcher et al. | 51/129 |
| 4,270,316 | 6/1981 | Kramer et al. | 51/283 R |
| 4,373,991 | 2/1983 | Banks | 156/645 |
| 4,435,247 | 3/1984 | Basi et al. | 156/636 |
| 4,519,168 | 5/1985 | Cesna | 51/216 LP |
| 4,600,469 | 7/1986 | Fusco et al. | 156/636 |
| 4,811,522 | 3/1989 | Gill, Jr. | 451/285 |
| 4,944,119 | 7/1990 | Gill, Jr. et al. | 51/215 R |
| 4,954,142 | 9/1990 | Carr et al. | 51/309 |
| 5,081,795 | 1/1992 | Tanaka et al. | 51/131.1 |
| 5,095,661 | 3/1992 | Gill, Jr. et al. | 51/131.3 |
| 5,193,316 | 3/1993 | Olmstead | 51/281 |
| 5,205,082 | 4/1993 | Shendon et al. | 51/283 R |
| 5,230,184 | 7/1993 | Bukhman | 51/283 R |
| 5,232,875 | 8/1993 | Tuttle et al. | 437/225 |
| 5,398,459 | 3/1995 | Okumura et al. | |
| 5,423,558 | 6/1995 | Koeth et al. | |
| 5,423,716 | 6/1995 | Strasbaugh et al. | |
| 5,441,444 | 8/1995 | Nakajima | |
| 5,443,416 | 8/1995 | Volodarsky et al. | |
| 5,476,414 | 12/1995 | Hirose et al. | |
| 5,498,199 | 3/1996 | Karlsrud et al. | |
| 5,527,209 | 6/1996 | Volodarsky et al. | |
| 5,562,530 | 10/1996 | Runnels et al. | 451/36 |

FOREIGN PATENT DOCUMENTS

WO 94/19153  9/1994  WIPO ............... B24B 37/04

Primary Examiner—James G. Smith
Assistant Examiner—Derris H. Banks
Attorney, Agent, or Firm—Fish & Richardson, P.C.

[57] ABSTRACT

A carrier head uses a pressure chamber and a gimbal. The gimbal allows the carrier base to pivot with respect to the drive shaft about a point at the interface between the substrate and the polishing pad. The gimbal may "float" so that no downward force is applied to the substrate through the gimbal. A rolling diaphragm seals the carrier base to the carrier housing to form a chamber. By pressurizing the chamber, an even load can be applied across the substrate. A retaining ring is independently loaded by an inflatable bladder. Torque is transferred from the carrier housing to the carrier base by horizontal pins positioned near the substrate. The pins can slide vertically in the housing, but not laterally. However, there is sufficiently elasticity to allow the torque pins to comply with manufacturing tolerances so that both torque pins bear the rotational load.

23 Claims, 22 Drawing Sheets

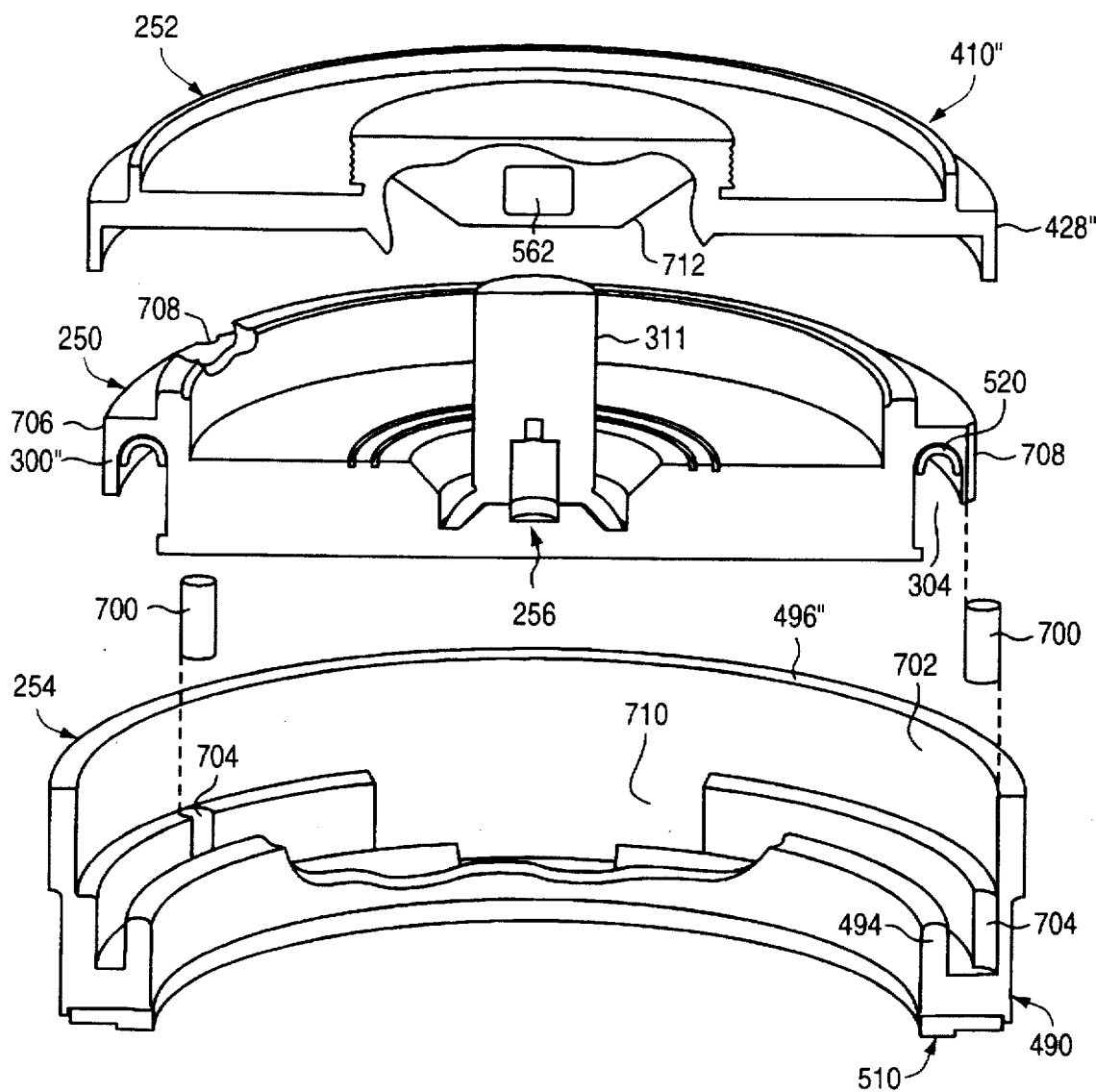

CARRIER HEAD DESIGN FOR A CHEMICAL MECHANICAL POLISHING APPARATUS

CROSS REFERENCE TO RELATED APPLICATIONS

This application is related to pending U.S. application Ser. No. 08/549,474, filed Oct. 27, 1995, and entitled CONTINUOUS PROCESSING SYSTEM FOR CHEMICAL MECHANICAL POLISHING. The entire disclosure of that application is hereby incorporated by reference.

BACKGROUND OF THE INVENTION

The present invention relates to chemical mechanical polishing of substrates, and more particularly to a carrier head for a chemical mechanical polishing system.

Integrated circuits are typically formed on substrates, particularly silicon wafers, by the sequential deposition of conductive, semiconductive or insulative layers. After each layer is deposited, the layer is etched to create circuitry features. As a series of layers are sequentially deposited and etched, the outer or uppermost surface of the substrate, i.e., the exposed surface of the substrate, becomes successively more non-planar. This occurs because the distance between the outer surface and the underlying substrate is greatest in regions of the substrate where the least etching has occurred, and least in regions where the greatest etching has occurred. With a single patterned underlying layer, this non-planar surface comprises a series of peaks and valleys wherein the distance between the highest peak and the lowest valley may be the order of 7000 to 10,000 Angstroms. With multiple patterned underlying layers, the height difference between the peaks and valleys becomes even more severe, and can reach several microns.

This non-planar outer surface presents a problem for the integrated circuit manufacturer. If the outer surface is non-planar, then photolithographic techniques to pattern photoresist layers might not be suitable, as a non-planar surface can prevent proper focusing of the photolithography apparatus. Therefore, there is a need to periodically planarize this substrate surface to provide a planar layer surface. Planarization, in effect, polishes away a non-planar, outer surface, whether a conductive, semiconductive, or insulative layer, to form a relatively flat, smooth surface. Following planarization, additional layers may be deposited on the outer layer to form interconnect lines between features, or the outer layer may be etched to form vias to lower features.

Chemical mechanical polishing is one accepted method of planarization. This planarization method typically requires that the substrate be mounted on a carrier or polishing head, with the surface of the substrate to be polished exposed. The substrate is then placed against a rotating polishing pad. In addition, the carrier head may rotate to provide additional motion between the substrate and polishing surface. Further, a polishing slurry, including an abrasive and at least one chemically-reactive agent, may be spread on the polishing pad to provide an abrasive chemical solution at the interface between the pad and substrate.

Important factors in the chemical mechanical polishing process are: the finish (roughness) and flatness (lack of large scale topography) of the substrate surface, and the polishing rate. Inadequate flatness and finish can produce substrate defects. The polishing rate sets the time needed to polish a layer. Thus, it sets the maximum throughput of the polishing apparatus.

Each polishing pad provides a surface which, in combination with the specific slurry mixture, can provide specific polishing characteristics. Thus, for any material being polished, the pad and slurry combination is theoretically capable of providing a specified finish and flatness on the polished surface. The pad and slurry combination can provide this finish and flatness in a specified polishing time. Additional factors, such as the relative speed between the substrate and pad, and the force pressing the substrate against the pad, affect the polishing rate, finish and flatness.

Because inadequate flatness and finish can create defective substrates, the selection of a polishing pad and slurry combination is usually dictated by the required finish and flatness. Given these constraints, the polishing time needed to achieve the required finish and flatness sets the maximum throughput of the polishing apparatus.

An additional limitation on polishing throughput is "glazing" of the polishing pad. Glazing occurs when the polishing pad is heated and compressed in regions where the substrate is pressed against it. The peaks of the polishing pad are pressed down and the pits of the polishing pad are filled up, so the surface of the polishing pad becomes smoother and less abrasive. As a result, the polishing time required to polish a substrate increases. Therefore, the polishing pad surface must be periodically returned to an abrasive condition, or "conditioned", to maintain a high throughput.

An additional consideration in the production of integrated circuits is process and product stability. To achieve a low defect rate, each successive substrate should be polished under similar conditions. Each substrate should be polished by approximately the same amount so that each integrated circuit is substantially identical.

In view of the foregoing, there is a need for a chemical mechanical polishing apparatus which optimizes polishing throughput, flatness, and finish, while minimizing the risk of contamination or destruction of any substrate.

Specifically, there is a need for a carrier head that provides a substantially uniform pressure across the substrate surface being polished. The carrier head should be able to stay substantially parallel to the polishing pad. The temperature of the substrate during polishing should also be controllable.

Additional advantages of the invention will be set forth in the description which follows, and in part will be obvious from the description, or may be learned by practice of the invention. The advantages of the invention may be realized by means of the instrumentalities and combinations particularly pointed out in the claims.

SUMMARY OF THE INVENTION

One embodiment of the present invention is a carrier head for a chemical mechanical polishing apparatus. The carrier head includes a housing, a base, a loading mechanism, and a gimbal mechanism. The housing is connected to a drive shaft to rotate about a first axis. The base holds a substrate against a polishing pad. The loading mechanism causes the base to press the substrate against the polishing pad. The gimbal mechanism pivotally connects the housing to the base to permit the base to rotate about a point, which may be located along the first axis, at an interface between the substrate and the polishing pad.

In another embodiment, a carrier head comprises a housing, a base, a loading mechanism, and a gimbal mechanism. The gimbal mechanism connects the housing to the base to permit the base to rotate and to transmit horizontal forces from the base to the housing.

The carrier head may rotate about a second axis substantially perpendicular to the first axis. The loading mechanism may include a flexible seal connecting the base to the housing to form a chamber therebetween. The gimbal mechanism may include a gimbal race connected to the carrier, a gimbal rod which slides in a passage in the housing, and a bearing connected to the gimbal rod. A gap may separate the rod from a ceiling of the passage. The gimbal race having a spherical inner surface which engages the spherical outer surface of the bearing. The gimbal mechanism may also include a spring to force the outer surface of the bearing against the inner surface of the gimbal race.

In another embodiment, a carrier head for a chemical mechanical polishing apparatus comprises a housing, a base, a loading mechanism, and a pin (or pins) extending substantially horizontally to connect the base to the housing and cause the base to rotate about the first axis.

The housing may includes a vertically elongated aperture through which the pin extends. A slider may fit in the elongated aperture, and the pin may extend through a hole in the slider. The slider is substantially free to move vertically in the aperture, but is substantially restrained from moving laterally.

In another embodiment, a carrier head comprises a housing, a base, a loading mechanism, and retaining ring assembly. The base has a body and a first annular flange, and a gap separates the flange from the body. The retaining ring has a second annular flange which fits into the gap. An annular U-shaped bladder is disposed in the gap between the flange and the base.

A flexible fluid connection may pass through a chamber between the housing and the base to link a passage in the housing to the U-shaped bladder.

BRIEF DESCRIPTION OF THE DRAWINGS

The accompanying drawings, which are incorporated in and constitute a part of the specification, schematically illustrate a preferred embodiment of the invention, and together with the general description given above and the detailed description of the preferred embodiment given below, serve to explain the principles of the invention.

FIG. 21 is a an exploded, schematic, and partially cross-sectional view of a carrier head in accordance with the present invention.

DESCRIPTION OF THE PREFERRED EMBODIMENT(S)

Figure 1A:
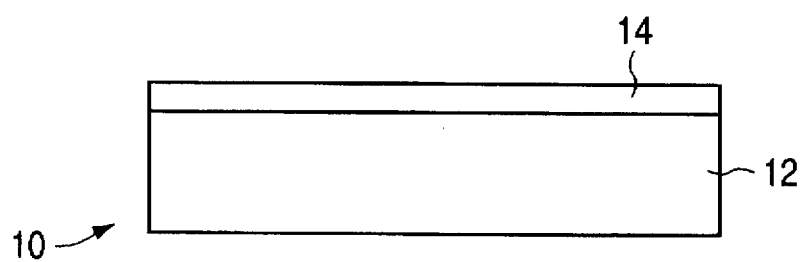
FIGS. 1A–1E are schematic diagrams illustrating the deposition and etching of a layer on a substrate.
Figure 1B:
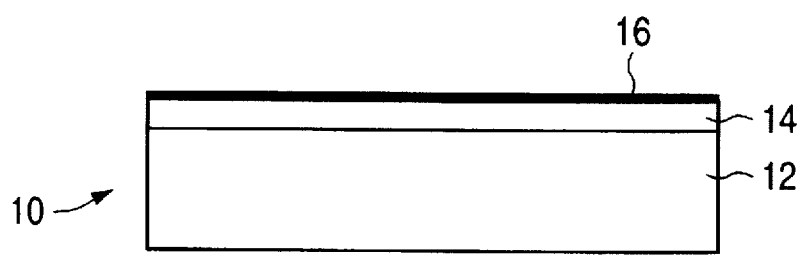
Figure 1C:
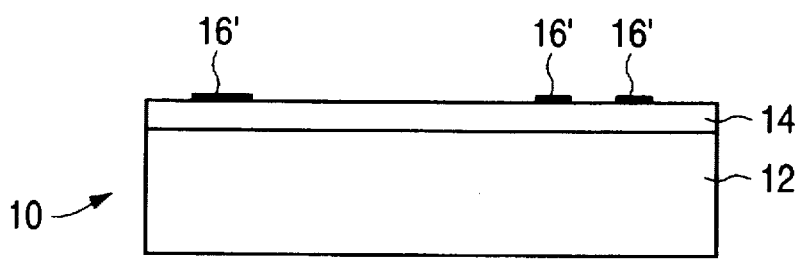
Figure 1D:
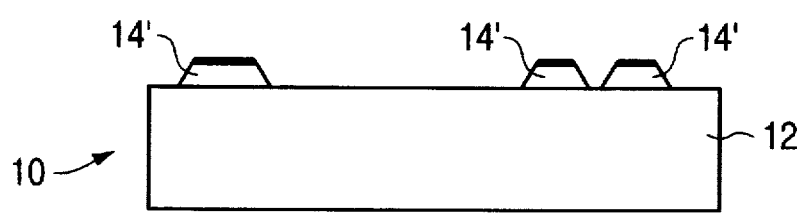
Figure 1E:
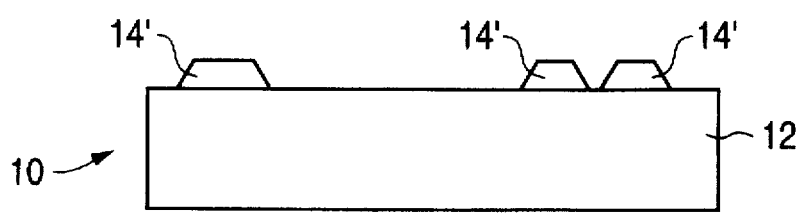

FIGS. 1A–1E illustrate the process of depositing a layer onto a planar surface of a substrate. As shown in FIG. 1A, a substrate 10 might be processed by coating a flat semi-conductive silicon wafer 12 with a metal layer 14, such as aluminum. Then, as shown in FIG. 1B, a layer of photoresist 16 may be placed on metal layer 14. Photoresist layer 16 can then be exposed to a light image, as discussed in more detail below, producing a patterned photoresist layer 16' shown in FIG. 1C. As shown in FIG. 1D, after patterned photoresist layer 16' is created, the exposed portions of metal layer 14 are etched to create metal islands 14'. Finally, as shown in FIG. 1E, the remaining photoresist is removed.

Figure 2A:
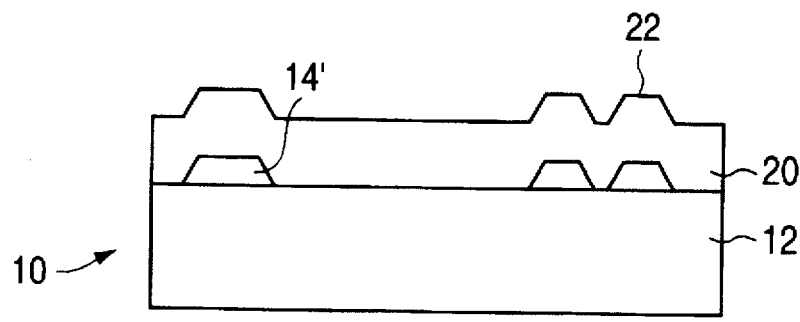
FIGS. 2A–2C are schematic diagrams illustrating the polishing of a non-planar outer surface of a substrate.
Figure 2B:
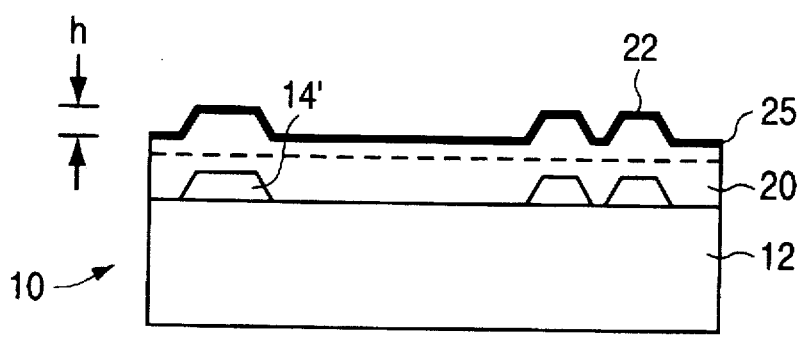

FIGS. 2A–2B illustrate the difficulty presented by deposition of subsequent layers on a substrate. As shown in FIG. 2A, an insulative layer 20, such as silicon dioxide, may be deposited over metal islands 14'. The outer surface 22 of insulative layer 20 almost exactly replicates the underlying structures of the metal islands, creating a series of peaks and valleys so outer surface 22 is non-planar. An even more complicated outer surface would be generated by depositing and etching multiple layers on an underlying patterned layer.

If, as shown in FIG. 2B, outer surface 22 of substrate 10 is non-planar, then a photoresist layer 25 placed thereon is also non-planar. A photoresist layer is typically patterned by a photolithographic apparatus that focuses a light image onto the photoresist. Such an imaging apparatus typically has a depth of focus of about 0.2 to 0.4 microns for sub-halfmicron feature sizes. If the photoresist layer 25 is sufficiently non-planar, that is, if the maximum height difference h between a peak and valley of outer surface 22 is greater than the depth of focus of the imaging apparatus, then it will be impossible to properly focus the light image onto the entire surface 22. Even if the imaging apparatus can accommodate the non-planarity created by a single underlying patterned layer, after the deposition of a sufficient number of patterned layers, the maximum height difference will exceed the depth of focus.

It may be prohibitively expensive to design new photolithographic devices having an improved depth of a focus. In addition, as the feature size used in integrated circuits becomes smaller, shorter wavelengths of light must be used, resulting in further reduction of the available depth of focus.

Figure 2C:
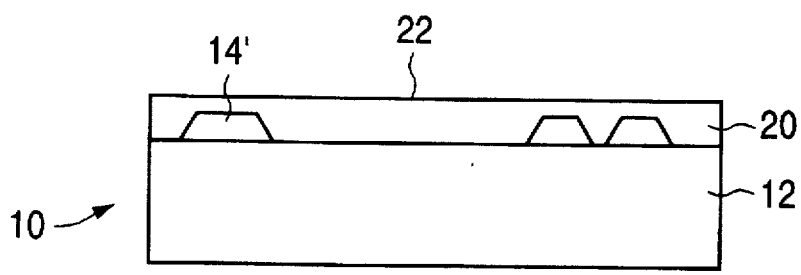

A solution, as shown in FIG. 2C, is to planarize the outer surface. Planarization wears away the outer surface, whether metal, semiconductive, or insulative, to form a substantially smooth, flat outer surface 22. As such, the photolithographic apparatus can be properly focused. Planarization could be performed only when necessary to prevent the peak-to-valley difference from exceeding the depth of focus, or planarization could be performed each time a new layer is deposited over a patterned layer.

Polishing may be performed on metallic, semiconductive, or insulative layers. The particular reactive agents, abrasive particles, and catalysts will differ depending on the surface being polishing. The present invention is applicable to polishing of any of the above layers.

Figure 3:
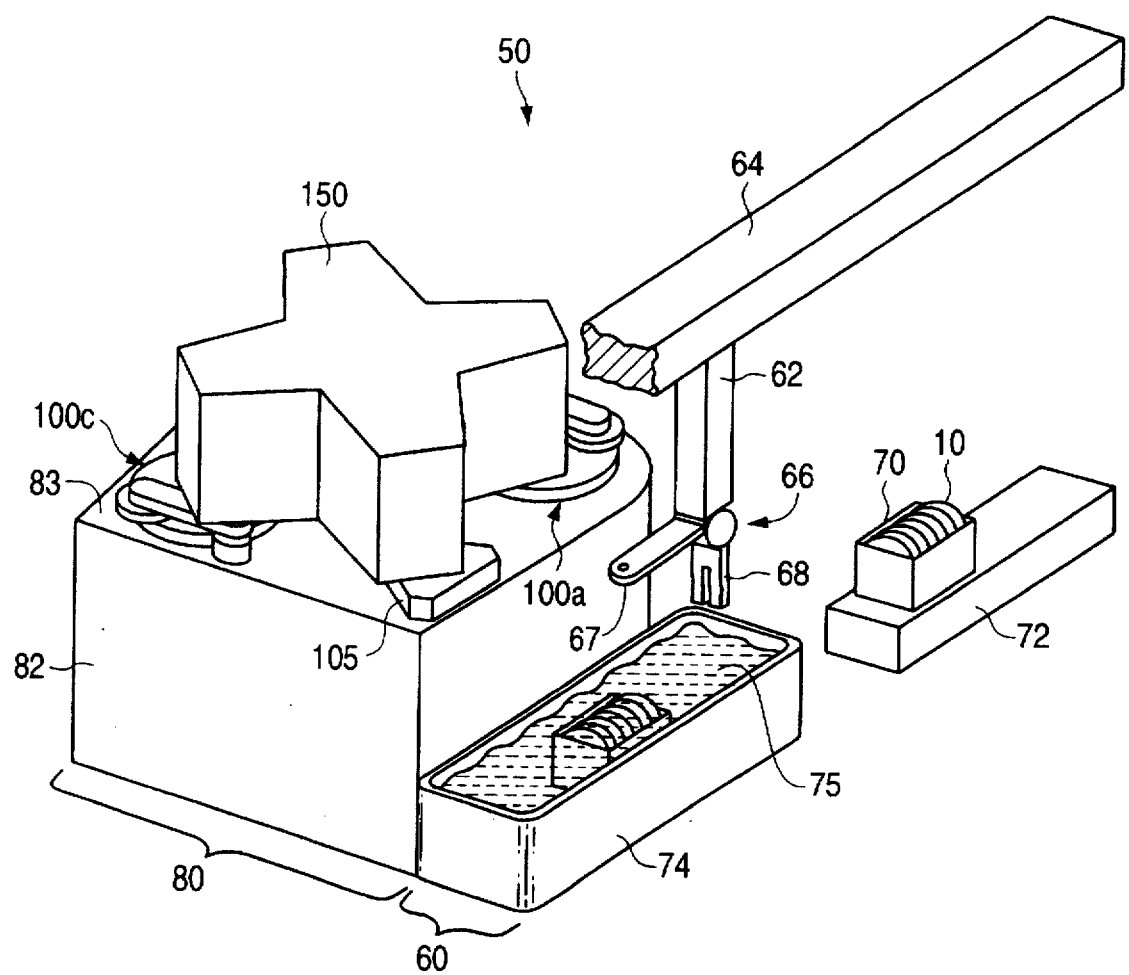
FIG. 3 is a schematic perspective view of a chemical mechanical polishing apparatus.

As shown in FIG. 3, a chemical mechanical polishing system 50 according to the present invention includes a loading apparatus 60 adjacent to a polishing apparatus 80. Loading apparatus 60 includes a rotatable, extendable arm 62 hanging from an overhead track 64. In the figure, overhead track 64 has been partially cut-away to more clearly show polishing apparatus 80. Arm 62 ends in a wrist assembly 66 which includes a blade 67 with a vacuum port and a cassette claw 68.

Substrates 10 are brought to polishing system 50 in a cassette 70 and placed on a holding station 72 or directly into a tub 74. Cassette claw 68 on arm 64 may be used to grasp cassette 70 and move it from holding station 72 to tub 74. Tub 74 is filled with a liquid bath 75, such as deionized water. Blade 67 fastens to an individual substrate from cassette 70 in tub 74 by vacuum suction, removes the substrate from cassette 70, and loads the substrate into polishing apparatus 80. Once polishing apparatus 80 has completed polishing the substrate, blade 67 returns the substrate to the same cassette 70 or to a different one. Once all of the substrates in cassette 70 are polished, claw 68 may remove cassette 70 from tub 74 and return the cassette to holding station 72.

Figure 4:
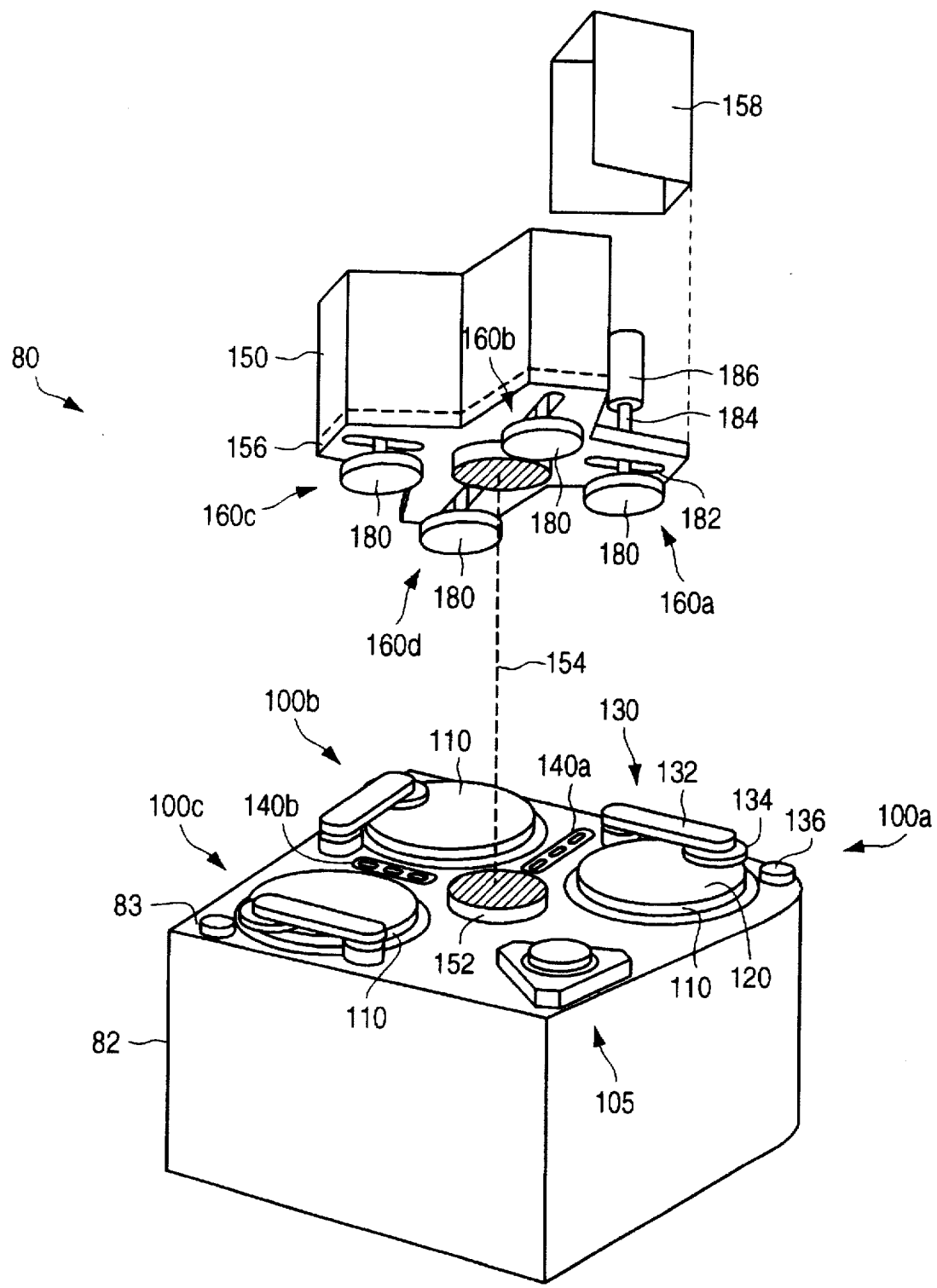
FIG. 4 is a schematic exploded perspective view of the chemical mechanical polishing apparatus of FIG. 3.

Polishing apparatus 80 includes a lower machine base 82 with a table top 83 mounted thereon and removable upper outer cover (not shown). As best seen in FIG. 4, table top 83 supports a series of polishing stations 100a, 100b and 100c, and a transfer station 105. Transfer station 105 forms a generally square arrangement with the three polishing stations 100a, 100b and 100c. Transfer station 105 serves multiple functions of receiving individual substrates 10 from loading apparatus 60, washing the substrates, loading the substrates into carrier heads (to be described below), receiving the substrates from the carrier heads, washing the substrates again, and finally transferring the substrates back to loading apparatus 60 which returns the substrates to the cassette.

Each polishing station 100a, 100b, or 100c includes a rotatable platen 110 on which is placed a polishing pad 120. Each polishing station 100a, 100b and 100c may further include an associated pad conditioner apparatus 130. Each pad conditioner apparatus 130 has a rotatable arm 132 holding an independently rotating conditioner head 134 and an associated washing basin 136. The conditioner apparatus maintains the condition of the polishing pad so it will effectively polish any substrate pressed against it while it is rotating.

Two or more intermediate washing stations 140a and 140b are positioned between neighboring polishing stations 100a, 100b, 100c and transfer station 105. The washing stations rinse the substrates as they pass from one polishing station to another.

A rotatable multi-head carousel 150 is positioned above lower machine base 82. Carousel 150 is supported by a center post 152 and rotated thereon about a carousel axis 154 by a carousel motor assembly located within base 82. Center post 152 supports a carousel support plate 156 and a cover 158. Multi-head carousel 150 includes four carrier head systems 160a, 160b, 160c, and 160d. Three of the carrier head systems receive and hold a substrate, and polish it by pressing it against the polishing pad 120 on platen 110 of polishing stations 100a, 100b and 100c. One of the carrier head systems receives substrates from and delivers substrates to transfer station 105.

In the preferred embodiment, the four carrier head systems 160a–160d are mounted on carousel support plate 156 at equal angular intervals about carousel axis 154. Center post 152 supports carousel support plate 156 and allows the carousel motor to rotate the carousel support plate 156 and to orbit the carrier head systems 160a–160d, and the substrates attached thereto, about carousel axis 154.

Each carrier head system 160a–160d includes a polishing or carrier head 180. Each carrier head 180 independently rotates about its own axis, and independently laterally oscillates in a radial slot 182 formed in support plate 156. A carrier drive shaft 184 connects a carrier head rotation motor 186 to carrier head 180 (shown by the removal of one-quarter of cover 158). There is one carrier drive shaft and motor for each head.

The substrates attached to the bottom of carrier heads 180 may be raised or lowered by the polishing head systems 160a–160d. An advantage of the overall carousel system is that only a short vertical stroke is required of the polishing head systems to accept substrates, and position them for polishing and washing. An input control signal (e.g., a pneumatic, hydraulic, or electrical signal), causes expansion or contraction of carrier head 180 of the polishing head systems in order to accommodate any required vertical stroke. Specifically, the input control signal causes a lower carrier member having a wafer receiving recess to move vertically relative to a stationary upper carrier member.

During actual polishing, three of the carrier heads, e.g., those of polishing head systems 160a–160c, are positioned at and above respective polishing stations 100a–100c. Each rotatable platen 110 supports a polishing pad 120 with a top surface which is wetted with an abrasive slurry. Carrier head 180 lowers a substrate to contact polishing pad 120, and the abrasive slurry acts as the media for both chemically and mechanically polishing the substrate or wafer.

After each substrate is polished, polishing pad 120 is conditioned by conditioning apparatus 130. Arm 132 sweeps conditioner head 134 across polishing pad 120 in an oscillatory motion generally between the center of polishing pad 120 and its perimeter. Conditioner head 134 includes an abrasive surface, such as a nickel-coated diamond surface. The abrasive surface of conditioner head 134 is pressed against rotating polishing pad 120 to abrade and condition the pad.

In use, the polishing head 180, for example, that of the fourth carrier head system 160d, is initially positioned above the wafer transfer station 105. When the carousel 150 is rotated, it positions different carrier head systems 160a, 160b, 160c, and 160d over the polishing stations 100a, 100b and 100c, and the transfer station 105. The carousel 150 allows each polishing head system to be sequentially located, first over the transfer station 105, and then over one or more of the polishing stations 100a–100c, and then back to the transfer station 105.

Figure 5A:
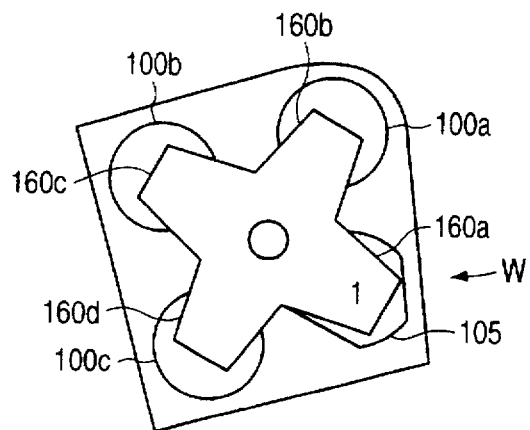
FIGS. 5A–5F are schematic top views of the polishing apparatus illustrating the progressive movement of wafers as they are sequentially loaded and polished.
Figure 5B:
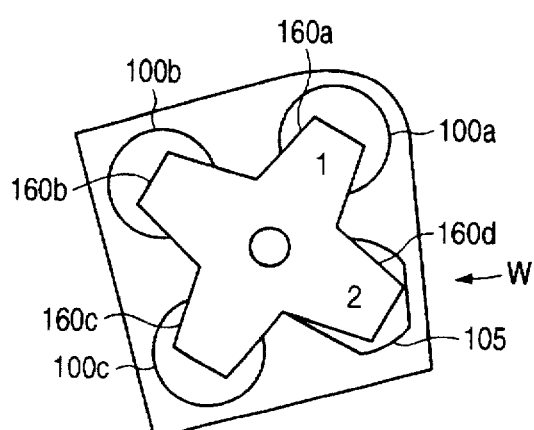
Figure 5C:
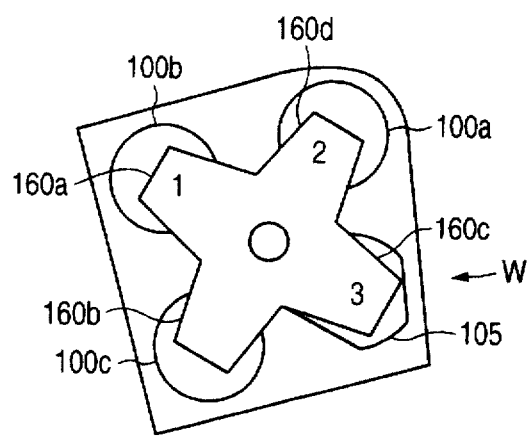
Figure 5D:
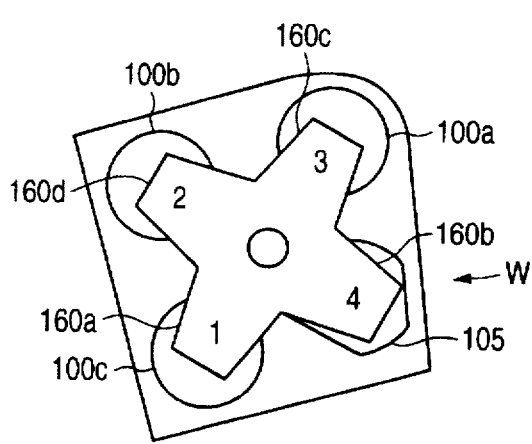
Figure 5E:
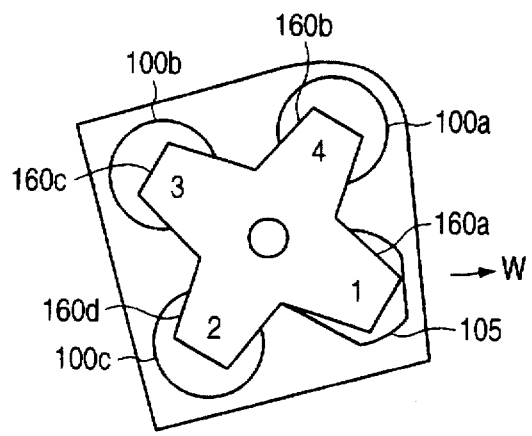
Figure 5F:
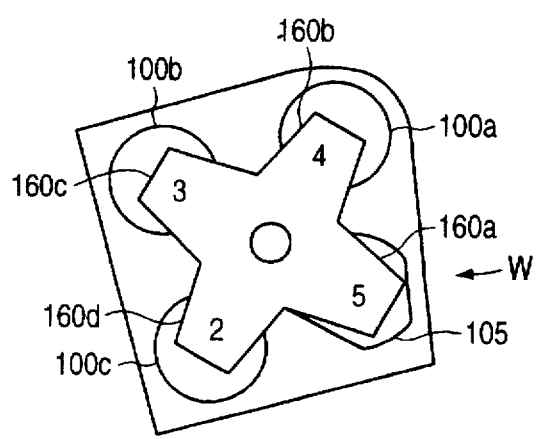

FIGS. 5A–5F show the carrousel 150 and its movement with respect to the insertion of a substrate such as a wafer (W) and subsequent movement of carrier head systems 160a–160d. As shown in FIG. 5A, a first wafer W#1 is loaded from loading apparatus 60 into transfer station 105, where the wafer is washed and then loaded into a carrier head 180, e.g., that of a first carrier head system 160a. Carousel 150 is then rotated counter-clockwise on supporting center post 152 so that, as shown in FIG. 5B, first carrier head system 160a with wafer W#1 is positioned at the first polishing station 100a, which performs a first polish of wafer W#1. While first polishing station 100a is polishing wafer W#1, a second wafer W#2 is loaded from loading apparatus 60 to transfer station 105 and from there to a second carrier head system 160b, now positioned over transfer station 105. Then carousel 150 is again rotated counter-clockwise by 90° so that, as shown in FIG. 5C, first wafer W#1 is positioned over second polishing station 100b and second wafer W#2 is positioned over first polishing station 100a. A third carrier head system 100c is positioned over transfer station 105, from which it receives a third wafer W#3 from loading system 60. In a preferred embodiment, during the stage shown in FIG. 5C, wafer W#1 at second polishing station 100b is polished with a slurry of finer grit than wafer W#1 at the first polishing station 100a. In the next stage, as illustrated by FIG. 5D, carousel 150 is again rotated counter-clockwise by 90° so as to position wafer W#1 over third polishing station 100c, wafer W#2 over second polishing station 100c, and wafer W#3 over first polishing station 100a, while a fourth carrier head system 160d receives a fourth wafer W#4 from loading apparatus 60. The polishing at third polishing station 100c is presumed to be even finer than that of second polishing station 100b. After the completion of this stage, carousel 150 is again rotated. However, rather than rotating it counter-clockwise by 90°, carousel 150 is rotated clockwise by 270°. By avoiding continuous rotation in one direction, carousel 150 may use simple flexible fluid and electrical connections rather than complex rotary couplings. The rotation, as shown in FIG. 5E, places wafer W#1 over transfer station 105, wafer W#2 over third polishing station 100c, wafer W#3 over second polishing station 100b, and wafer W#4 over first polishing station 100a. While wafers W#1–W#3 are being polished, wafer W#1 is washed at transfer station 105 and returned from carrier head system 160a to loading apparatus 60. Finally, as illustrated by FIG. 5F, a fifth wafer W#5 is loaded into first carrier head system 160a. After this stage, the process is repeated.

Figure 6:
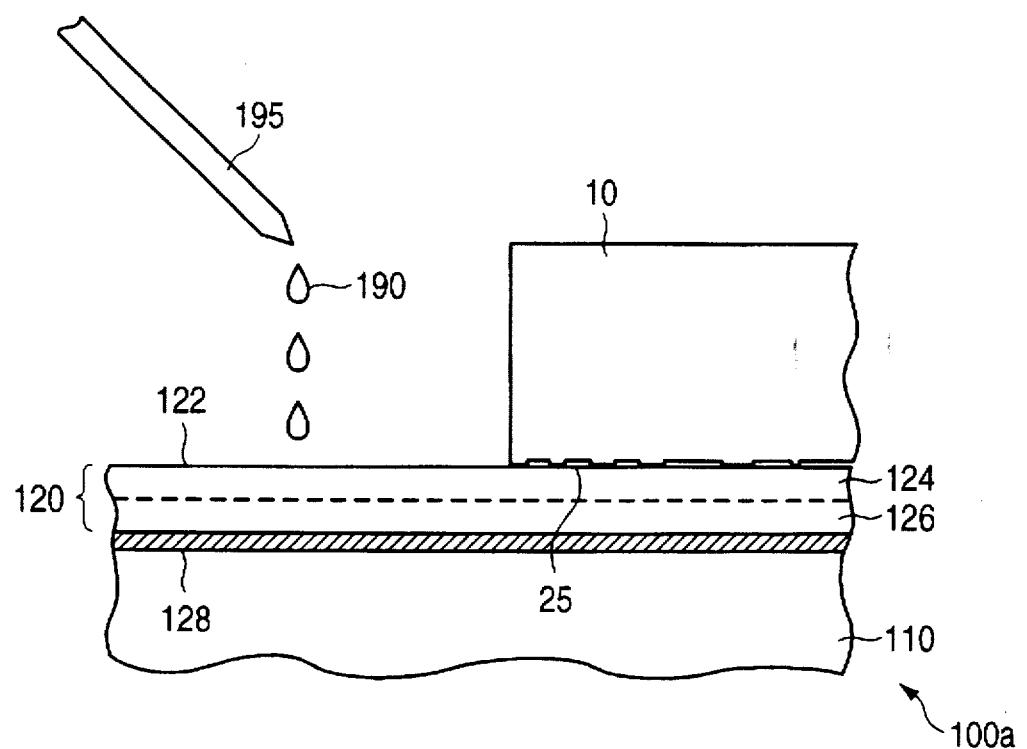
FIG. 6 is a schematic side view of a substrate on a polishing pad.

As shown in FIG. 6, a carrier head system, such as system 160a, lowers substrate 10 to engage a polishing station, such as polishing station 100a. As noted, each polishing station includes a rigid platen 110 supporting a polishing pad 120. If substrate 10, is an eight-inch (200 mm) diameter disk, then platen 110 and polishing pad 120 will be about twenty inches in diameter. Platen 110 is preferably a rotatable aluminum or stainless steel plate connected by stainless steel platen drive shaft (not shown) to a platen drive motor (not shown). For most polishing processes, the drive motor rotates platen 120 at thirty to two-hundred revolutions per minute, although lower or higher rotational speeds may be used.

Polishing pad 120 is a hard composite material with a roughened surface 122. Polishing pad 120 may have a fifty mil thick hard upper layer 124 and a fifty mil thick softer lower layer 126. Upper layer 124 is preferably a material composed of polyurethane mixed with other fillers. Lower layer 126 is preferably a material composed of compressed felt fibers leached with urethane. A common two-layer polishing pad, with the upper layer composed of IC-1000 and the lower layer composed of SUBA-4, is available from Rodel, Inc., located in Newark, Del. (IC-1000 and SUBA-4 are product names of Rodel, Inc.). In one embodiment, polishing pad 120 is attached to platen 110 by a pressure-sensitive adhesive layer 128.

Each carrier head system includes a rotatable carrier head. The carrier head holds substrate 10 with the top surface 22 pressed face down against outer surface 122 of polishing pad 120. For the main polishing step, usually performed at station 100a, carrier head 180 applies a force of approximately four to ten pounds per square inch (psi) to substrate 10. At subsequent stations, carried head 180 may apply more or less force. For example, for a final polishing step, usually performed at station 100c, carrier head 180 applies about three psi. Carrier drive motor 186 (see FIG. 4) rotates carrier head 180 at about thirty to two-hundred revolutions per minute. In a preferred embodiment, platen 110 and carrier head 180 rotate at substantially the same rate.

A slurry 190 containing a reactive agent (e.g., deionized water for oxide polishing), abrasive particles (e.g., silicon dioxide for oxide polishing) and a chemically reactive catalyzer (e.g., potassium hydroxide for oxide polishing), is supplied to the surface of polishing pad 120 by a slurry supply tube 195. Sufficient slurry is provided to cover and wet the entire polishing pad 120.

Chemical mechanical polishing is a fairly complex process, and differs from simple wet sanding. In a polishing process a reactive agent in slurry 190 reacts with surface 22 of top layer 20, which may be a conductive, semiconductive, or insulative layer, and with the abrasive particles to form reactive sites. The interaction of the polishing pad, abrasive particles, and reactive agent with the substrate results in polishing.

Figure 7:
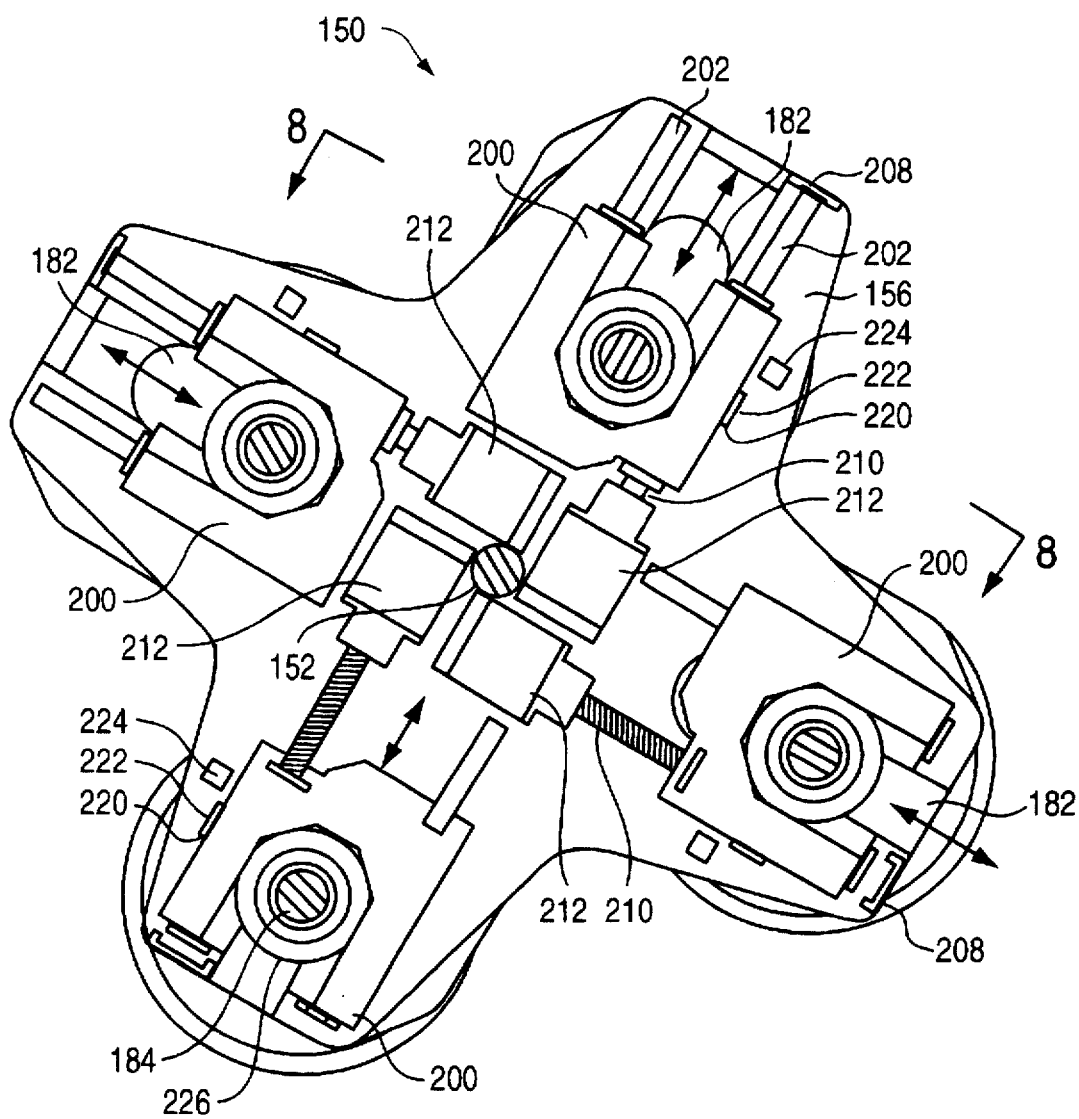
FIG. 7 is a schematic top view of a carousel, with the upper housing removed.

As shown in FIG. 7, in which cover 158 of carousel 150 has been removed, carousel support plate 156 supports the four carrier head systems 160a–160d. Carousel support plate includes four slots 182, generally extending radially and oriented 90° apart. Slots 182 may either be close-ended (as shown) or open-ended. The top of support plate 156 supports four slotted carrier head support slides 200. Each slide 200 aligns along one of the slots 182 and moves freely along a radial path with respect to support plate 156. Two linear bearing assemblies 201 bracket each slot 182 to support each slide 200.

Figure 8:
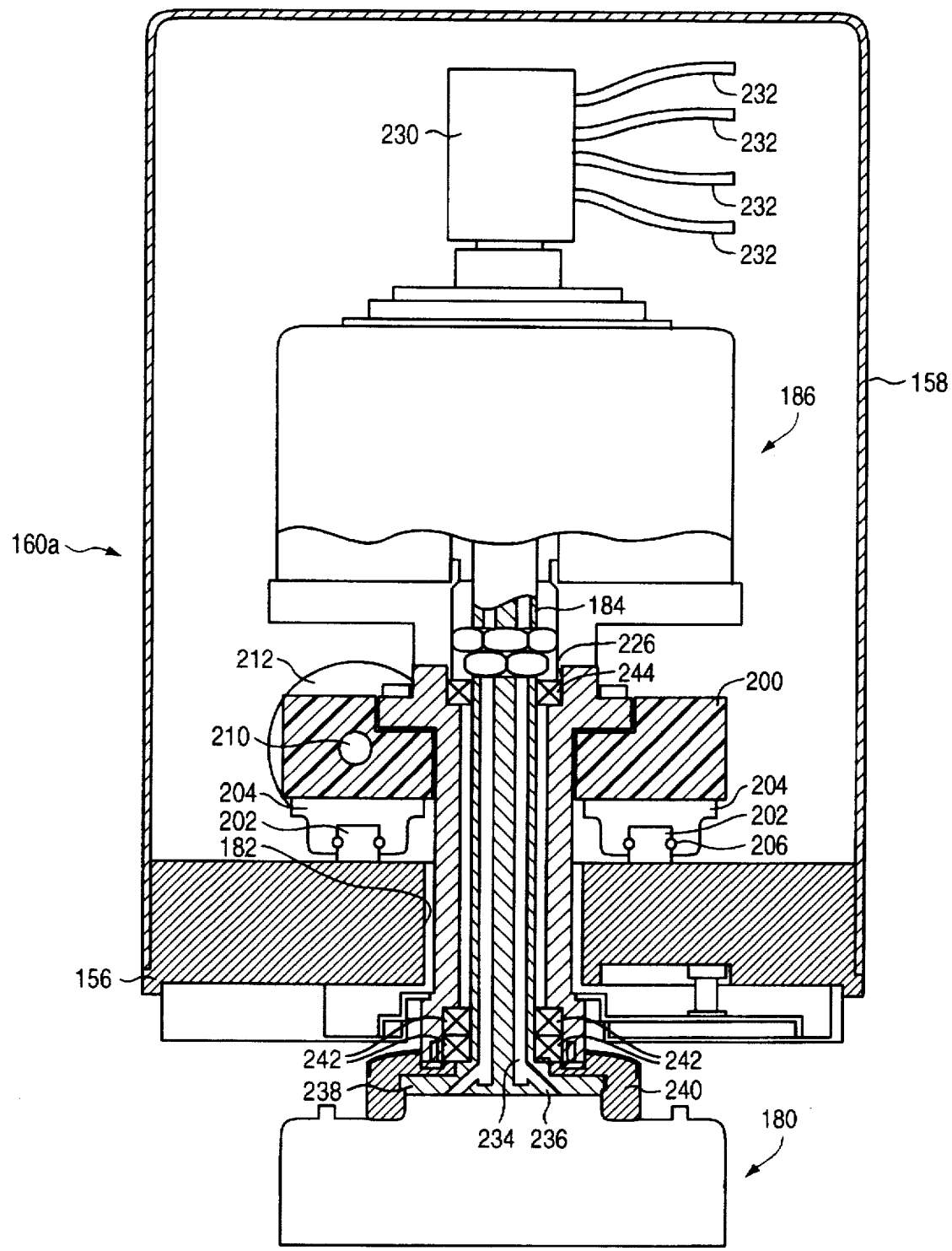
FIG. 8 is a cross-sectional view of the carrier head of FIG. 7 along line 8—8.

As shown in both FIGS. 7 and 8, each linear bearing assembly 201 includes a rail 202 fixed to support plate 156, and two hands 204 (only one of which is illustrated in FIG. 8) fixed to slide 200 which grasp the rail. A bearing 206 separates each hand 204 from rail 202 to provide free and smooth movement therebetween. Thus, the linear bearing assemblies permit the slides 200 to move freely along slots 182.

A bearing stop 208 anchored to the outer end one of the rails 202 prevents slide 200 from accidentally coming off the end of the rails. One of the arms of each slide 200 contains an unillustrated threaded receiving cavity or nut fixed to the slide near its distal end. The threaded cavity or nut receives a worm-gear lead screw 210 driven by a slide radial oscillator motor 212 mounted on support plate 156. When motor 212 turns lead screw 210, slide 200 moves radially. The four motors 212 are independently operable to independently move the four slides 200 along the slots 182 in carrousel support plate 156.

Each slide 200 is associated with an optical position sensor 224. An angle iron 220 having a horizontally extending wing 222 is attached to the worm side of each slide 200. Optical position sensor 224 is fixed to support plate 156. The height of sensor 224 is such that wing 222 passes through the two jaws of the sensor 224, and the linear position of sensor 224 along slot 182 is such that wing 222 passes from one side of sensor 224 to the other when slide 200 moves from its radially innermost position to its radially outermost position. Although the slide position is monitored by the input to motor 212 or an encoder attached thereto, such monitoring is indirect and accumulates error. The optical position sensor 224 calibrates the electronic monitoring and is particularly useful when there has been a power outage or similar loss of machine control.

A carrier head assembly, each including a carrier head 180, a carrier drive shaft 184, a carrier motor 186, and a surrounding non-rotating shaft housing 226, is fixed to each of the four slides 200. Drive shaft housing 226 holds drive shaft 184 by paired sets of lower ring bearings 242 and a set of upper ring bearings 244. Each carrier head assembly can be assembled away from polishing apparatus 80, slid in its untightened state into slot 182 in carousel support plate 156 and between the arms of slide 200, and there tightened to grasp the slide.

A rotary coupling 230 at the top of drive motor 186 couples four fluid or electrical lines 232 into four channels 234 in drive shaft 184 (only two channels are shown because FIG. 8 is a cross-sectional view). Angled passages 236 formed in a base flange 238 of drive shaft 184 connect the four channels 234 to receiving channels in carrier head 180. Channels 234 are used, as described in more detail below, to pneumatically power carrier head 180, to control the temperature of the carrier head, and to vacuum-chuck the substrate to the bottom of the carrier head.

Figure 9:
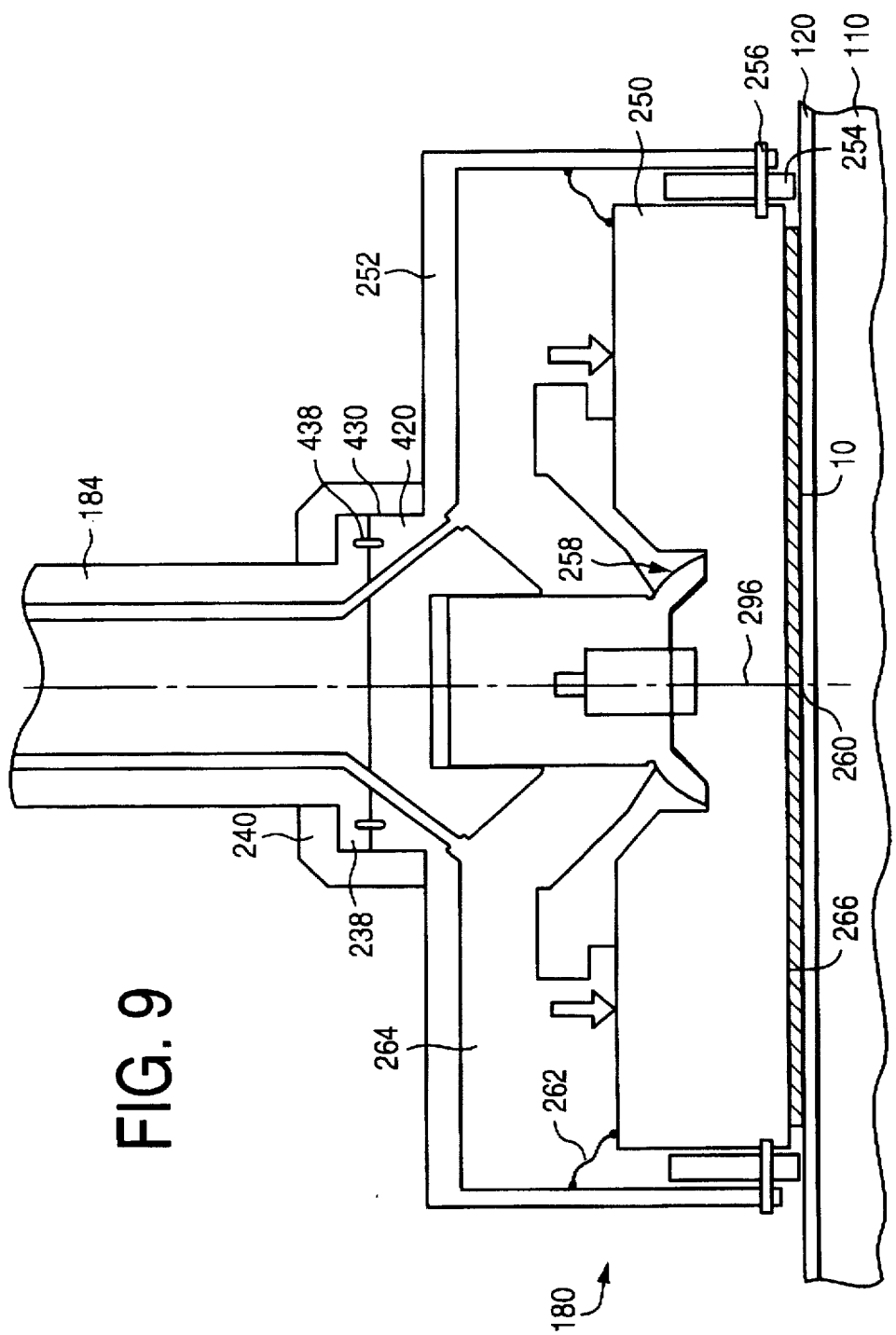
FIG. 9 is a schematic diagram of the main components of a carrier head in accordance with the present invention.

As shown schematically in FIG. 9, carrier head 180 consists of three major assemblies: a base assembly 250, a housing assembly 252 and a retaining ring assembly 254. Each of these assemblies are explained in detail below.

Base assembly 250 applies a load to substrate 10; that is, it pushes substrate 10 against polishing pad 120. Housing assembly 252 is connected to and rotated by drive shaft 184. Torque pins 256 connect housing assembly 252 to base assembly 250 to transfer torque to the base assembly and rotate it. Base assembly 250 includes a gimbal mechanism 258 which allows base assembly 250 and retaining ring assembly 254 to pivot in two dimensions about a point 260 at the interface between substrate 10 and polishing pad 120. Gimbal mechanism 258 is "unloaded"; that is, no downward pressure is applied from housing assembly 252 through the gimbal mechanism to base assembly 250. However, gimbal mechanism 258 transfers any sideload, such as the shear force caused by the friction between the substrate and polishing pad, to the housing assembly 252 without affecting the uniformity of the pressure on the substrate. In addition, gimbal mechanism 258 keeps the base assembly rotating about the same axis as the drive shaft.

A seal 262 connects base assembly 250 to housing assembly 252 to create a pressure chamber 264. Fluid, preferably air, is pumped through one of the channels 234 in drive shaft 184 into and out of pressure chamber 264 to control the load applied to base assembly 250. Gimbal mechanism 258 can slide vertically with respect to housing assembly 252 so that it continues to transfer side load and to keep the base assembly rotating about the same axis as the drive shaft, independent of the distance between the base assembly and housing assembly.

Retaining ring assembly 254 prevents the shear forces created by the motion of polishing pad 120 from pushing substrate 10 out from underneath carrier head 180. Retaining ring assembly 254 projects down from the outer edge of carrier head 180 to contact polishing pad 120.

There are a number of advantages to this configuration. First, pressure chamber 264 applies the load substantially evenly across the entire substrate, rather than at the center of the substrate beneath the drive shaft. Second, a bottom surface 266 of the base assembly which holds substrate 10 on polishing pad 120 can pivot with respect to drive shaft 184 to remain parallel with the polishing pad and thereby apply a load evenly across the substrate. Third, housing assembly 252 transfers torque to base assembly 250 very near bottom surface 266 to reduce strain on the carrier head and improve load uniformity. Unlike other polishing systems which apply pressure unevenly across the substrate, carrier head 180 evenly distributes pressure across wafer 10, even as the carrier head moves over non-uniform regions of polishing pad 120.

As shown in FIGS. 8 and 9, carrier head 180 is connected to drive shaft 184 through housing assembly 252. As described in greater detail below, housing assembly 252 includes a hub 420. Several dowel pins 438 are placed in paired dowel holes in hub 420 and flange 238 to circumferentially align angular channels 236 in drive shaft 184 with receiving channels 436 in the carrier head (see FIG. 13). When drive shaft 184 rotates, dowel pins 438 transfer torque to the housing assembly 252 to rotate it about the same axis as the drive shaft. The hub has a threaded neck 430 to which a threaded perimeter nut 240 is attached. The perimeter nut has a lip that fits over the top of flange 238 to fix drive shaft 184 to carrier head 180.

Figure 10:
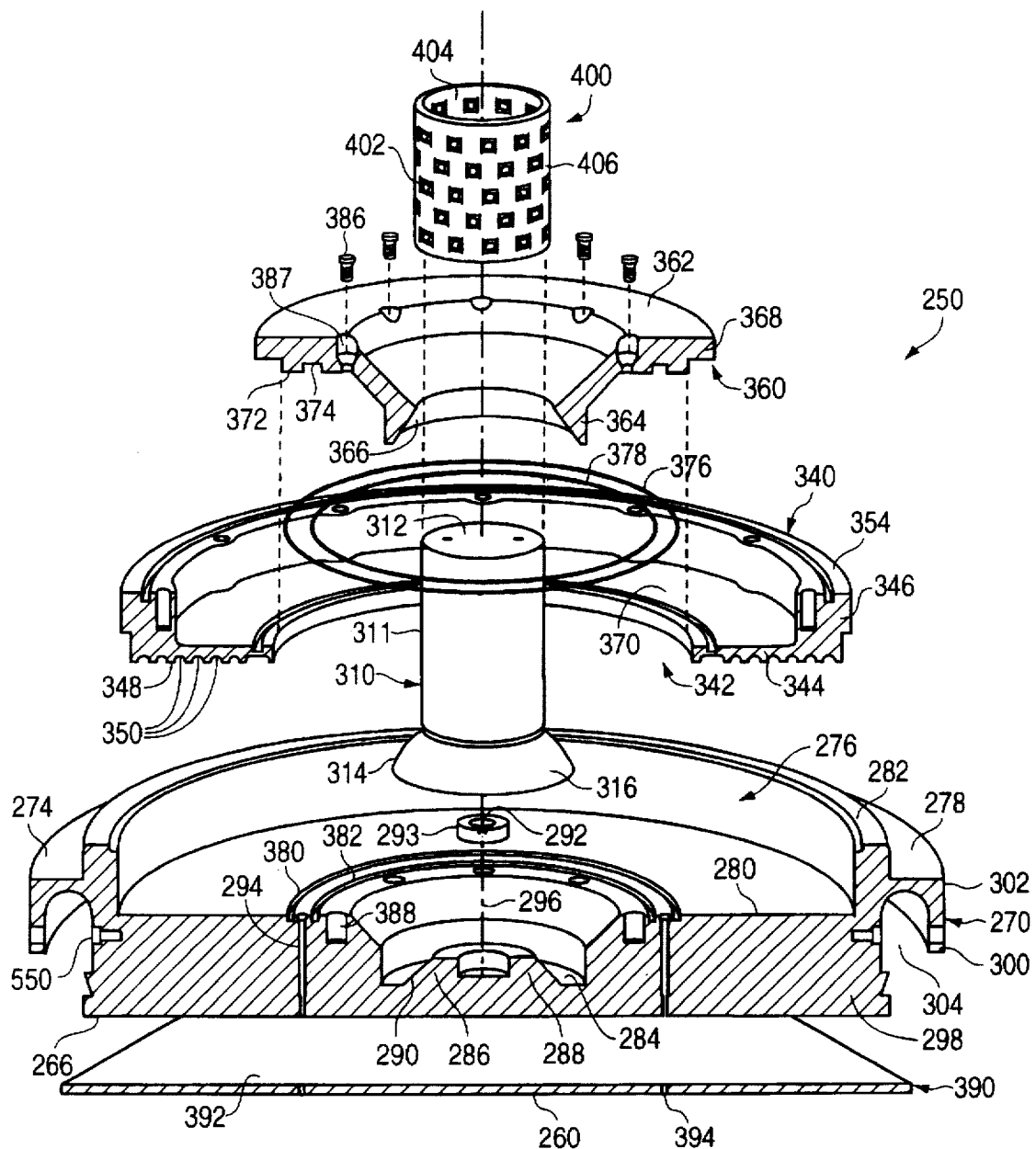
FIG. 10 is an exploded, schematic, and partially cross-sectional view of a base assembly of a carrier head in accordance with the present invention.

As shown in FIG. 10, base assembly 250 includes a disk-shaped carrier base 270 having a nearly flat bottom surface 266 which may contact substrate 10. Carrier base 270 could be aluminum or steel. A top surface 274 of carrier base 270 includes a circular basin 276 surrounded by a ledge 278. Basin 276 has a flat annular surface 280 surrounded by a rim 282. A moat 284 separates a squat conical turret 286 at the center of carrier base 270 from annular surface 280. Conical turret 286 has a flat top 288 with angled sides 290. At the center of conical turret 286 is a shallow conical depression 292. Conical depression 292 may be formed in a disk-shaped insert 293 which fits into a cylindrical depression in top 288.

Conduits 294, evenly spaced about a central axis 296 of carrier base 270, extend through a main body portion 298 of carrier base 270 from bottom surface 266 to annular surface 280. An annular flange 300 projects downwardly from an outer edge 302 of ledge 278, and a U-shaped gap 304 is formed by flange 300 and main body portion 298.

Figure 11:
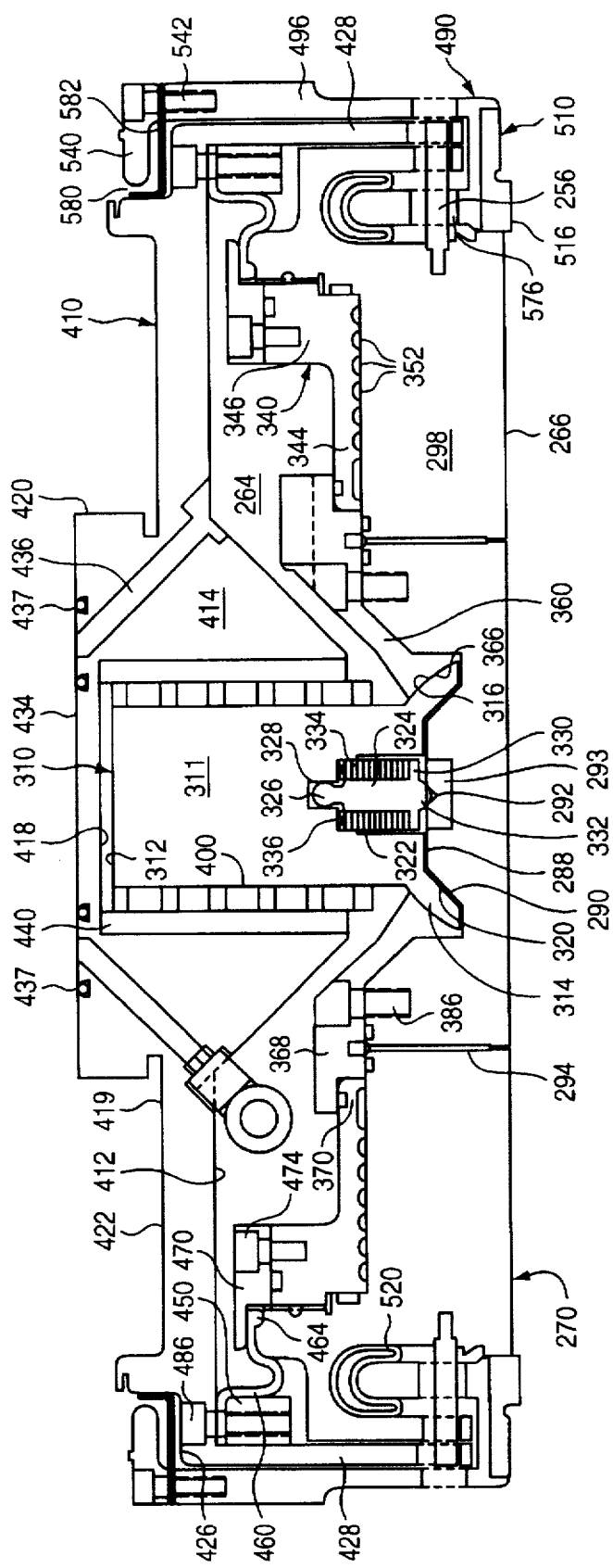
FIG. 11 is a schematic cross-sectional view of a carrier head in accordance with the present invention.

Gimbal mechanism 258 is located above conical turret 286 to allow base assembly 250 to rotate in two dimensions relative to housing assembly 252. Gimbal mechanism 258 includes a gimbal body 310 and a gimbal race 360. In one embodiment, gimbal mechanism 258 is formed of steel. Gimbal body 310 includes a cylindrical gimbal rod 311 with a top surface 312 which projects from a bearing base 314. Bearing base 314 has a spherical outer surface 316. As shown in FIG. 11, an inner surface 318 of bearing base 314 has a conical depression 320 which mates to conical turret 286 when base assembly 250 is fully assembled.

A cylindrical passage 322, as shown in FIG. 11, projects upwardly from the center of depression 320 into gimbal rod 311. Cylindrical passage 322 is broken into three longitudinal sections of decreasing diameter. Cylindrical passage 322 contains a guide pin 324. The top of guide pin 324 is a knob 326 which fits into an uppermost, narrowest section 328 of passage 322. The bottom of guide pin 324 includes a disk 330 with a spherical projection 332 which engages conical depression 292 in conical turret 286. A spring 334, which can be made of a stack of beveled washers, fits between a step or shoulder 336 in passage 322 and the top of disk 330 to "preload" the gimbal, that is, to provide a constant upward pressure on bearing base 314.

Figure 12:
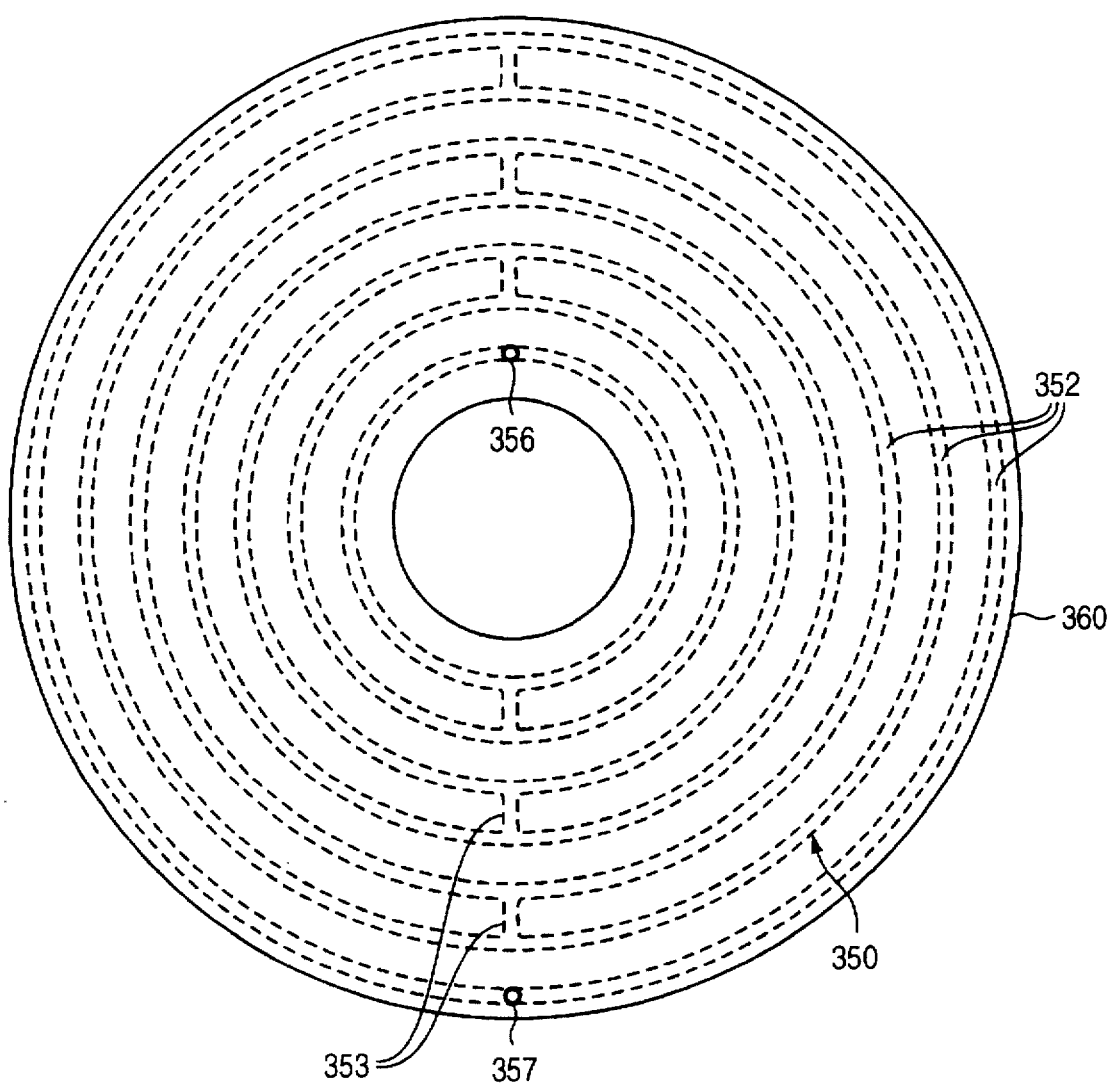
FIG. 12 is a schematic bottom view of a cooling plate for a base assembly of a carrier head.

Returning to FIG. 10, an annular cooling plate 340 rests on annular surface 280 within basin 276. Gimbal rod 311 projects through a center opening 342 in cooling plate 340. Cooling plate 340 has a thin inner ring 344 and a thick outer ring 346. Thick outer ring 346 abuts against the inner surface of rim 282 and is about the same height as rim 282. An underside 348 of cooling plate 340 rests against annular surface 280. Underside 348 of cooling plate 340 has a series of grooves. As can be seen more clearly in FIG. 12, the grooves form a series of concentric circular channels 352 which extend across the underside of cooling plate 340. Adjacent circular channels 352 are connected by cross-channels 353. When cooling plate 340 is pressed tightly against annular surface 280, the channels form a passageway 350 for the flow of a coolant fluid such as water. Consecutive cross-channels 353 are located 180° apart, so that coolant fluid must flow through the entire outer circular channel before entering the inner circular channel. Two connecting conduits 644 and 646 extend through inner ring 344 and outer ring 346 from cooling plate 340 underside 348 to the top surface 354 to connect an inlet 356 and an outlet 357 of channel 352 to two fittings 652 and 654 (see FIGS. 19A and 19B). Many other shapes are possible for passageway 350, including a spiral, or even a simple singular circle.

A gimbal race 360 fits around gimbal body 310 and extends through opening 342 of coolant plate 340 to rest on carrier base 270. Gimbal race 360 has a flat outer piece 362 which rests on annular surface 280 and a wedge-shaped inner piece 364 which fits into moat 284. A spherical inner surface 366 of wedge-piece 364 engages the spherical outer surface of bearing base 314. The outer edge of flat piece 362 has a lip 368 which fits above an inner edge 370 of inner ring 344.

An underside 372 of outer piece 362 has a circular groove 374. When gimbal race 360 is positioned against annular surface 280, circular groove 374 aligns with conduits 294 and forms a connecting passage. A conduit (not shown) extends through flat piece 362 to connect groove passage 374 to a fitting (not shown). The fitting may be connected to one of the channels 234 in carrier drive shaft 184. Vacuum may be applied through channel 234, groove 374 and conduits 294 to chuck substrate 10 to bottom surface 266 of carrier head 180. Alternately, air pressure may be applied through channel 234, groove passage 374, and conduits 294, to dislodge substrate 10 from bottom surface 266. Two O-rings 376 and 378, which may be formed of rubber, fit into circular grooves 380 and 382 in annular surface 280 to seal groove passage 374.

Bolts 386 fit through bolt-holes 387 in gimbal race 360 and engage corresponding threaded bolt-holes 388 in carrier base 270. In one embodiment, there are eight bolts (although only four are shown because of the cross-sectional and perspective view). The bolts 386 hold gimbal race 360 in place. Inner surface 366 of wedge piece 364 holds gimbal body 310 in place to compress spring 334 between carrier base 270 and gimbal body 310. Lip 368 of flat piece 362 holds coolant plate 340 in place in basin 276. An O-ring (not shown) may fit into a circular groove (not shown) in inner edge 370 to seal the inner edge of the coolant plate.

Once gimbal body 310 is secured by gimbal race 360, spring 334 will apply a force to bearing base 314 to push it against inner surface 366 of gimbal race 360. In addition, spring 334 will push spherical projection 332 of guide pin 324 into conical depression 292. This pressure will tend to push the center of the carrier base outwardly, possibly by several hundred micro-inches, so that bottom surface 266 of the carrier base is no longer planar. Therefore, after base assembly 250 is assembled, bottom surface 266 is lapped, i.e., polished, to restore a very flat surface.

Base assembly 250 may optionally include a wettable carrier film 390 positioned between carrier base 270 and substrate 10. The upper surface 392 of carrier film 390 is attached to bottom surface 266 of carrier base 270 by, for example, an adhesive. Holes 394 in carrier film 390 align with conduits 294 in carrier base 270. There is one hole 394 for each conduit 294. The bottom surface 396 of carrier film 390 will contact the wafer. Carrier film 390 may be a twenty mil thick sheet of urethane. Carrier film 390 is slightly compressible and conforms to the surface of the substrate. Also, carrier film 390 acts as a cushion to prevent slippage of the substrate 10 during polishing.

Base assembly 250 also includes a linear roller bearing 400, such as a roller cage assembly. Linear roller bearing 400 is a hollow cylindrical tube. Multiple small bearings 402 are set in gaps between an inner surface 404 and am outer surface 406 of this cylindrical tube. The inner surface 404 of linear roller bearing 400 fits snugly around gimbal rod 311. The small bearings 402 rotate about a lateral axis of rotation tangent to surfaces 404 and 406. Roller bearing 400 moves smoothly up and down gimbal rod 311.

Figure 13:
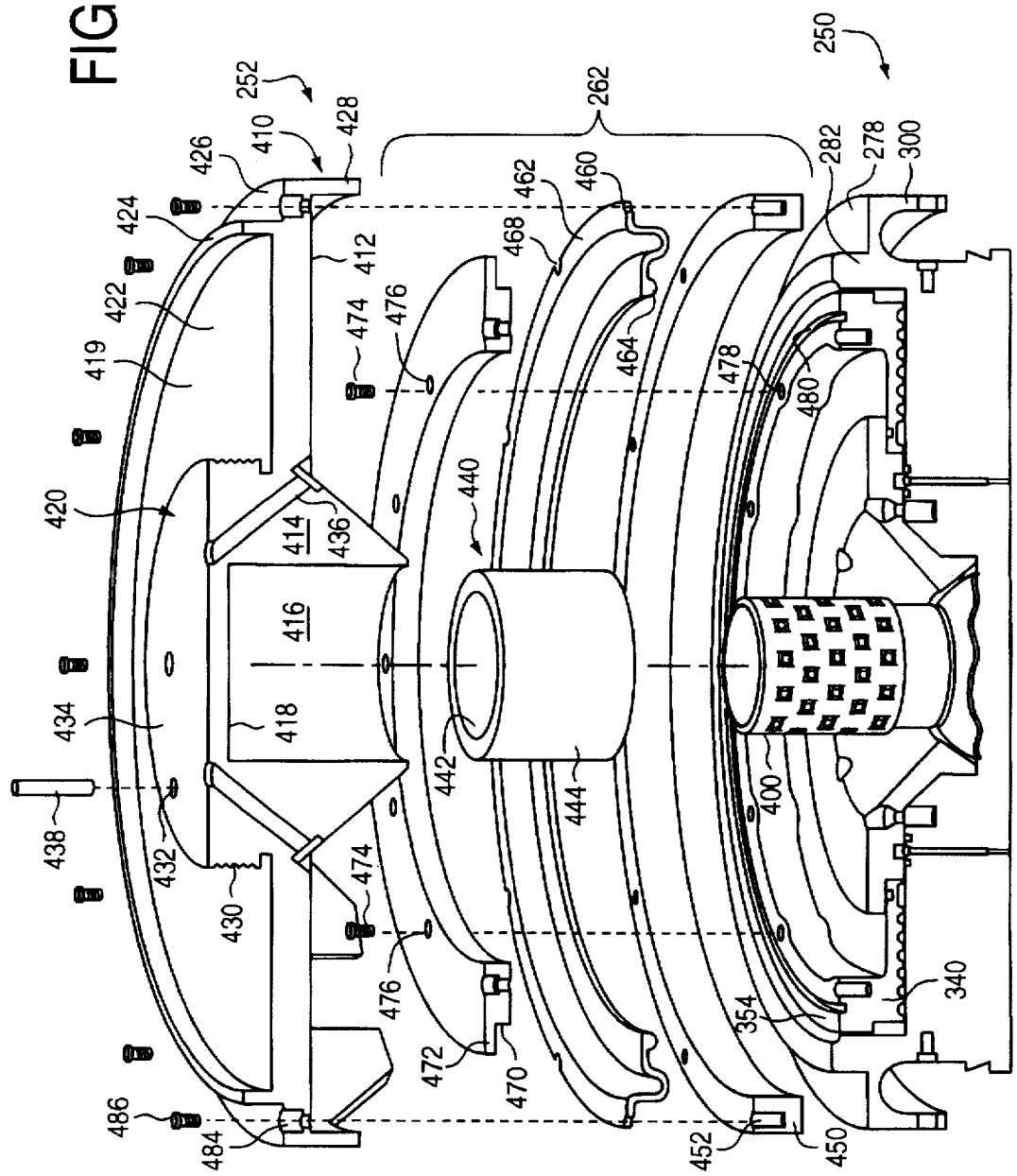
FIG. 13 is an exploded, schematic and partially cross-sectional view of a housing assembly of a carrier head in accordance with the present invention.

As shown in FIG. 13, housing assembly 252 includes an inverted bowl-shaped carrier housing 410. The housing assembly 252 may formed of aluminum. A bottom surface 412 of carrier housing 410 has a conical hub 414 and a cylindrical cavity 416 in the middle of the conical hub. Cylindrical cavity 416 is open at the bottom but closed at the top by a ceiling 418. A top surface 419 of carrier housing 410 includes a cylindrical hub 420 which projects above an annular area 422. A circular ridge 424 surrounds annular area 422, and a lower ledge 426 extends around circular ridge 424. A flange 428, which forms the sides of bowl-shaped carrier housing 410, projects downwardly from the edge of ledge 426. The lower rims of flange 300 of carrier base 270 and flange 428 of carrier housing 410 are at about the same height. However, as will be explained below, because base assembly 250 can move vertically relative to housing assembly 252, flanges 300 and 428 can move relative to each other.

Cylindrical hub 420 has a threaded neck 430, and two vertical dowel pin holes 432 (only one is shown) in a circular surface 434. Several angled conduits 436 extend through hub 420 from lower surface 412 to circular surface 434. There is one angled conduit 436 for each channel 234 in drive shaft 184. An O-ring 437 inset into top surface 434 of hub 420 surrounds each conduit 436 (see FIG. 11). Carrier head 180 may be attached to drive shaft 184 by placing two dowel pins 438 into dowel pin holes 432 and lifting the carrier head so that the dowel pins fit into paired dowel pin holes (not shown) in drive shaft flange 238. This aligns angled passages 236 to the angular conduits 436. Then threaded perimeter nut 240 can be screwed onto threaded neck 430 to attach carrier head 180 firmly to drive shaft 184.

Housing assembly 252 also includes a plain bushing 440, which may be formed of stainless steel. Bushing 440 fits into cylindrical cavity 416 with an outer surface 442 abutting the conical hub 414. When housing assembly 252 is lowered onto base assembly 250, linear roller bearing 400 engages an inner surface 444 of bushing 440. Cylindrical cavity 416 is sufficiently deep that top surface 312 of gimbal rod 311 does not touch ceiling 418 of cavity 416. This prevents pressure from being applied through gimbal body 310 to substrate 10; that is, there is no contact surface to transmit downward force from housing assembly 252 through gimbal mechanism 258 to base assembly 250.

Still referring to FIG. 13, seal 262 includes an outer clamp ring 450 which has a radius larger than rim 282. Outer clamp ring 450 has a rectangular cross-section and may rest, unfixed, on ledge 278. Outer clamp ring may have twelve evenly spaced threaded recesses 452 (only four are shown).

Seal 262 also includes a rollable diaphragm 460, formed of sixty mil thick silicone. Rollable diaphragm 460 is ring-shaped, with a flat outer section 462 and a inner edge 464. The inner portion of rollable diaphragm 460 rests on rim 282 of carrier base 270, with inner edge 464 fitting into a recess 466 which runs along the inner edge of rim 282. The outer portion of rollable diaphragm 460 rests on outer clamp ring 450. Rollable diaphragm 460 may have twelve slots 468 which may align with the twelve recesses 452 in outer clamp ring 450.

An inner clamp ring 470 is used to seal rolling diaphragm 460 to the base assembly 250. Inner clamp ring 470 rests primarily on top surface 354 of cooling plate 340. Inner clamp ring 470 has an outer lip 472 which projects over rim 282 of carrier base 270. Inner clamp ring 470 may have twelve holes 476 which align with matching threaded recesses 478 in thick outer ring 346 of cooling plate 340 (although only two are shown in FIG. 13). A threaded screw 474 passes through each hole 476 and engages threaded recess 478. The screws are tightened to firmly hold bulge 464 of diaphragm 460 in place in recess 466. In addition, an O-ring (not shown) may be placed in a circular groove 480 located between recesses 478 and rim 282. The bulge of diaphragm 460 and the O-ring in groove 480 seal the outer edge of cooling plate 340.

Seal 262 can be completed when housing assembly 252 is lowered onto base assembly 250. Carrier housing 410 may have twelve evenly spaced bolt holes 484 (although only five are shown in FIG. 13) formed in ledge 426. The bolt holes align with slots 468 in diaphragm 460. Twelve screws (again, only five are shown) 486 extend through holes 484 in carrier housing 410 and slots 468 in diaphragm 460 to engage threaded recesses 452 in outer clamp ring 450. When screws 486 are tightened, outer clamp ring 450 secures the outer portion of diaphragm 460 against bottom surface 412 of carrier housing 410. Thus, the space between housing assembly 252 and base assembly 250 is sealed to form pressure chamber 264.

Figure 14:
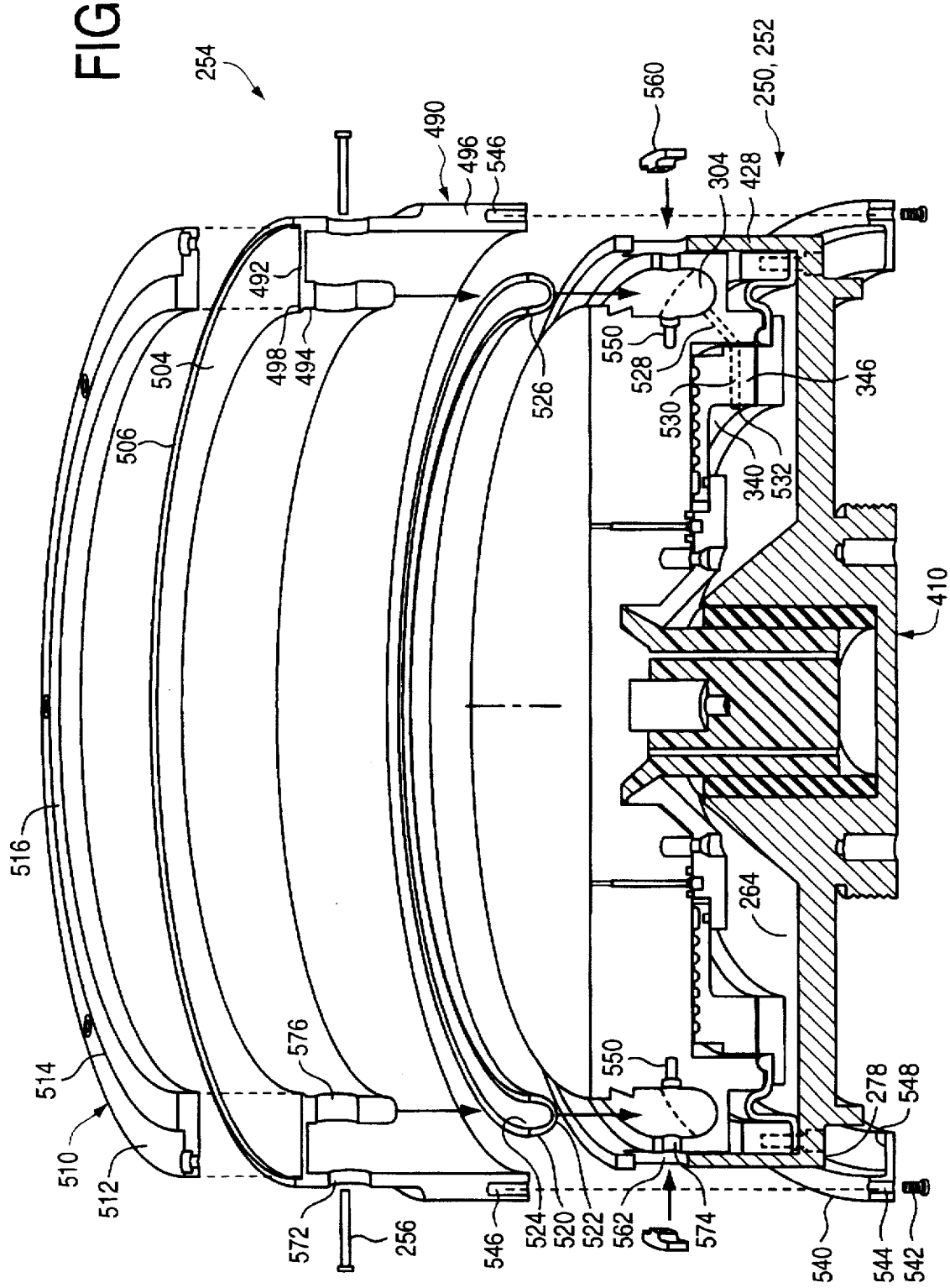
FIG. 14 is an exploded, schematic and partially cross-sectional view of a retaining ring assembly of a carrier head in accordance with the present invention.

As shown in FIG. 14, retaining ring assembly 254 is attached to base assembly 250 and housing assembly 252. FIG. 14 is a view in which the base assembly and housing assembly are inverted, and the assembled retaining ring assembly is lowered into position. As described below, retaining ring assembly 254 can be actuated to press against polishing pad 120 in order to hold substrate 10 in place beneath carrier head 180. Although retaining ring assembly 254 can be actuated to move vertically up and down relative to base assembly 250, the retaining ring assembly rotates with the base assembly.

Retaining ring assembly 254 includes an annular piston frame 490 with a generally J-shaped cross-section. Retaining ring assembly 254 may be formed aluminum. Piston frame 490 has a radially extending cross-piece 492, an inner annular flange 494 projecting downwardly from the inner edge of cross-piece 492, and an outer annular flange 496 projecting downwardly from the outer edge of cross-piece 492. Inner flange 494 fits inside U-shaped gap 304 of base assembly 250. Outer flange 496 is longer than inner flange 494, and it fits around the outside of flange 428 of housing assembly 252.

Figure 15:
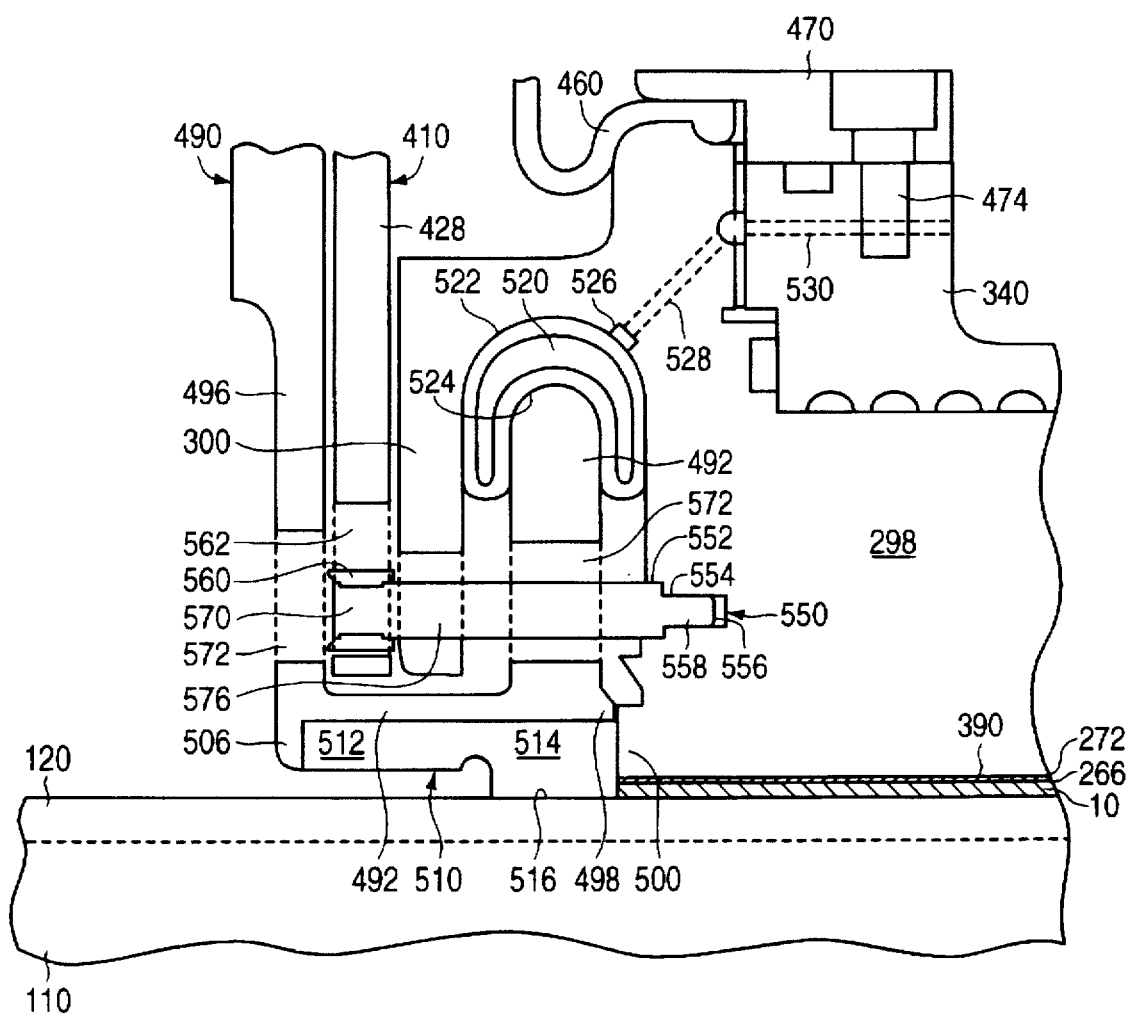
FIG. 15 is an enlarged view of a torque pin assembly of the carrier head shown in FIG. 11.

As shown in FIG. 15, a lip 498 projects laterally outwardly from the inner edge of cross-piece 492. Carrier base 270 has a matching lip 500 which projects outwardly from the bottom of main body 298. When carrier head 180 is assembled, lip 498 almost touches lip 500.

As shown in FIGS. 11 and 14, outer flange 496 extends above cross-piece 492 to form a ridge 506. Ridge 506 projects vertically beyond outer surface 504.

Retaining ring assembly 254 also includes a retaining ring 510. Retaining ring 510 is attached to outer surface 504 of cross-piece 492. Retaining ring 510 is a generally flat annular ring, which may be formed of plastic, having a outer ring 512 portion that is thinner than an inner ring portion 514. The outer ring 512 abuts ridge 506 and is of about the same height. Eight evenly spaced threaded recesses (not shown) may be formed in the outer surface 504 of cross-piece 492, and for each recess there may be bolt hole (not shown) extending through the outer ring 512 from top to bottom. A bolt (not shown) is inserted through each bolt hole into the matching recess in top surface 504 to attach retaining ring 510 to piston frame 490.

As shown in FIG. 15, the inner ring 514 almost touches lip 500 of carrier base 270. The surface 516 of inner ring 514 can project slightly below bottom surface 266 of base assembly 250 and touch polishing pad 120 (see FIG. 15). The shear force created by the relative velocity between substrate 10 and polishing pad 120 tends to push the substrate out from under carrier head 180. In the lowered position shown in FIG. 13, retaining ring 510 blocks substrate 10, preventing it from slipping out from under carrier base 270.

Returning to FIG. 14, retaining ring assembly 254 is actuated by an annular rubber bladder 520. Bladder 520 can simply be a small innertube, but preferably bladder 520 has a U-shaped cross-section. The convoluted shape of bladder 520 is designed to provide a force-pressure relationship that is insensitive to the position of the retaining ring assembly relative to the base assembly. Bladder 520 is located in U-shaped gap 304 of carrier head 270 with an underside 522 of the "U" resting at the bottom of the gap. Piston frame 490, with attached retaining ring 510, is positioned so that inner flange 494 fits tightly into an inside surface 524 of the "U" of bladder 520 (see also FIG. 15). Bladder 520 has a valve 526 which is inserted into a first channel 528 in carrier base 270. First channel 528 runs through main body 298 and connects to a second channel 530 in coolant plate 340. The second channel 530 leads to a fitting 532. The connection between first channel 528 and second channel 530 can be sealed by an O-ring (not shown). Fitting 532 is connected by a hose or bellows (see FIG. 19A) to one of the angled conduits 436 in conical hub 414. When air is forced through the channels, bladder 520 inflates and forces retaining ring 510 against polishing pad 120. Because bladder 520 and pressure chamber 264 can be independently pressurized, the loads applied to the retaining ring and the substrate are independent of each other and thus are independently controllable.

After piston frame 490 is positioned to engage bladder 520, a stop ring 540 is attached to the rim of outer flange 496 of piston frame 490. Bolts 542 pass through bolt-holes 544 in stop ring 540 and engage threaded recesses 546 in piston frame 490 to connect the ring to the frame. The underside 548 of stop ring 540 catches against ledge 426 to prevent retaining ring assembly 254 from falling off when carrier head 180 is lifted off polishing pad 120. A gap 580 separates retaining ring assembly 254 from housing assembly 252. A barrier 582 between stop ring 540 and ledge 426 and fits over gap 580 between flange 496 and flange 428 to block slurry from entering carrier head 180.

Figure 16:
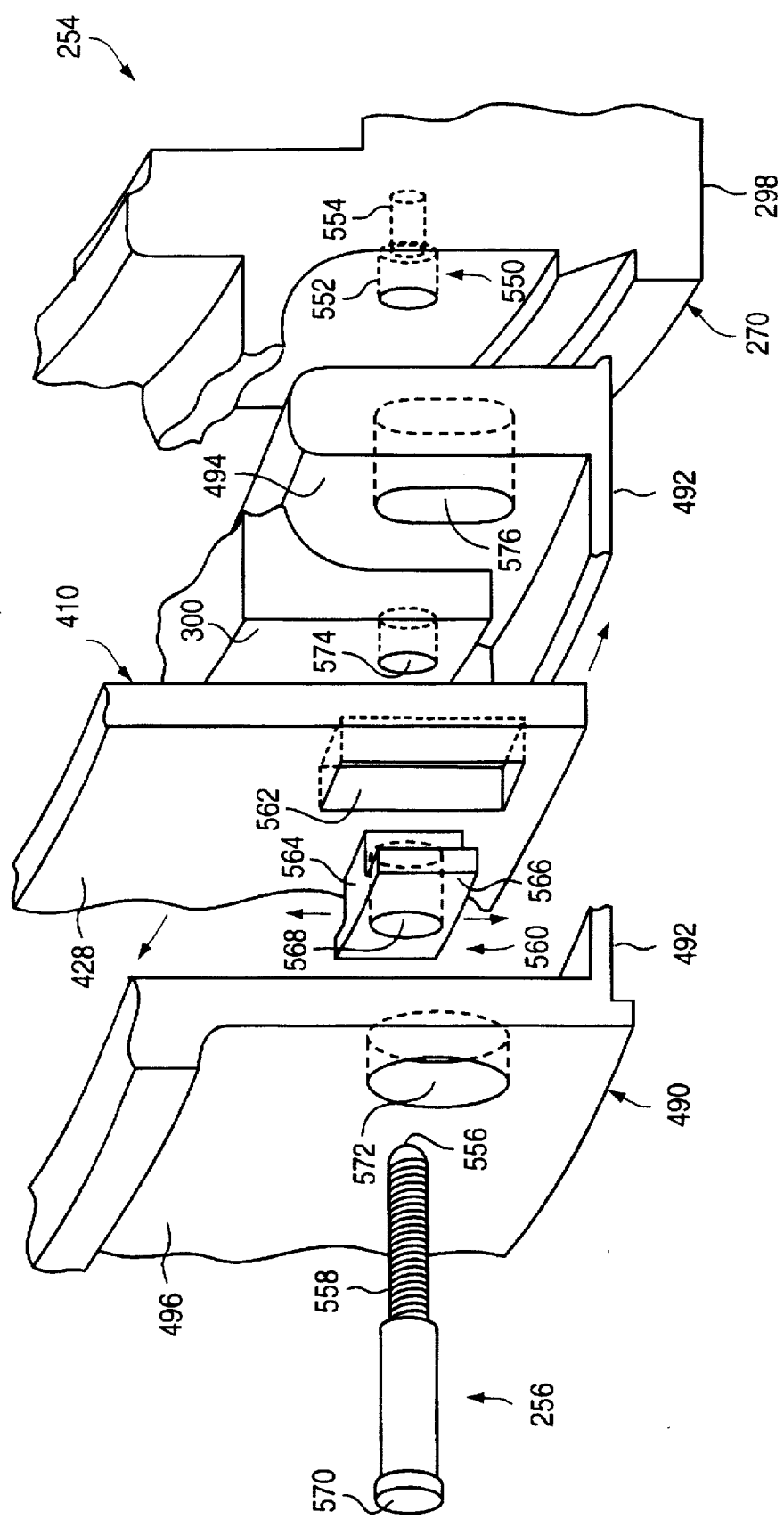
FIG. 16 is an exploded schematic view of a torque pin assembly for transferring torque from a housing assembly to a base assembly of a carrier head of the present invention.

As discussed above, torque pins 256 transfer torque from housing assembly 252 to base assembly 250, while permitting base assembly 250 to move vertically relative to housing assembly 252. Referring to FIGS. 14, 15 and 16, main body 298 of carrier base 270 has two opposing, lateral, pin-receiving recesses 550. Recesses 550 are located fairly close to bottom surface 266 of carrier base 270 so that torque is transferred in a plane close to the interface between carrier head 180 and substrate 10. Each recess 550 has an outer section 552 that is wider than a threaded inner section 554. Torque pin 256 passes through an aperture in each flange to fit into recess 550. Torque pin 256 has a beveled tip 556 to facilitate inserting the pin into recess 550, and a narrow threaded end 558 which engages threaded inner section 554.

The outer end of torque pin 256 is attached to housing assembly 252 by a slightly elastic slider 560 which fits into a rectangular slot 562 in flange 428. As shown most clearly in FIG. 16, slider 560 has a rectangular wedge portion 564 and two wings 566 which project laterally from rectangular wedge portion 564. A radial slider hole 568 is formed in slider 560. Slider 560 can be pressed into rectangular slot 562 so that wings 566 catch on flange 428. Wedge portion 564 of slider 560 has the same width as rectangular slot 562 but is shorter than slot 552 so that the slider can move vertically up and down in rectangular slot 562, but not laterally. Torque pin 256 is inserted through slider hole 568 until its head 570 catches against the outer surface of slider 564 or against an annular lip (not shown) inside slider hole 568. An O-ring (not shown) may fit inside slider hole 568 to elastically hold torque pin 256. When drive shaft 184 rotates carrier housing 410, flange 428 rotates. Since carrier base 270 is attached to flange 428 by torque pin 256 and slider 560, the carrier base will also rotate. There is sufficiently elasticity in the slider and O-ring to allow torque pin 256 to comply with manufacturing tolerances so that both torque pins bear the rotational load. Furthermore, since slider 560 can move up and down in rectangular slot 562, base assembly 250 can move vertically relative to housing assembly 252 without affecting the rotation.

As mentioned, torque pin 256 fits through openings in the other flanges. Outer flange 496 of piston frame 490 has an access aperture 572 for this purpose. Access aperture 572 does not transfer torque; it provides an opening for inserting torque pin 256 into slider 560. A circular aperture 574 in flange 300 of carrier base 270 aligns with recess 550 in main body 298, and an elongated aperture 576 in inner flange 494 of piston frame 490 aligns with circular aperture 574 and the other openings through which the torque pin will extend. Torque pin 256 fits into elongated aperture 576 and can move vertically but not horizontally in that aperture. Elongated aperture 576 transfers torque to the retaining ring assembly 254, while permitting it to move vertically independently of housing assembly 252 and base assembly 250.

As shown in FIG. 11, stop ring 540 interacts with torque pin 256 and elongated aperture 256 to prevent over-extension of diaphragm 460. When carrier base 270 is pushed down, torque pin 256 presses down on the bottom of elongated aperture 576. This pushes piston frame 490 downwardly, so that stop ring 540 catches on ledge 426.

Figure 17:
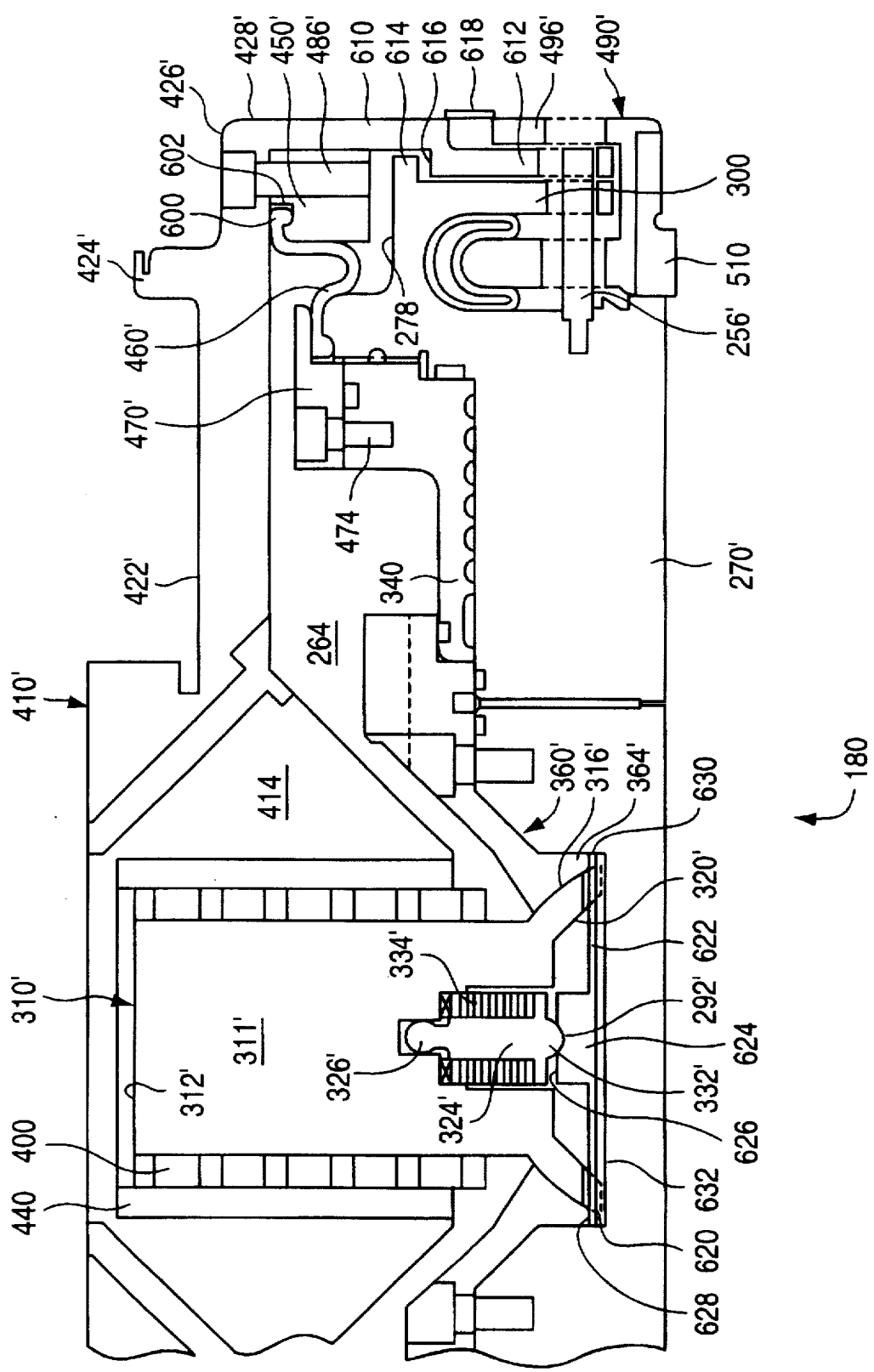
FIG. 17 is a schematic cross-sectional view of a portion of carrier head in accordance with the present invention.
Figure 18:
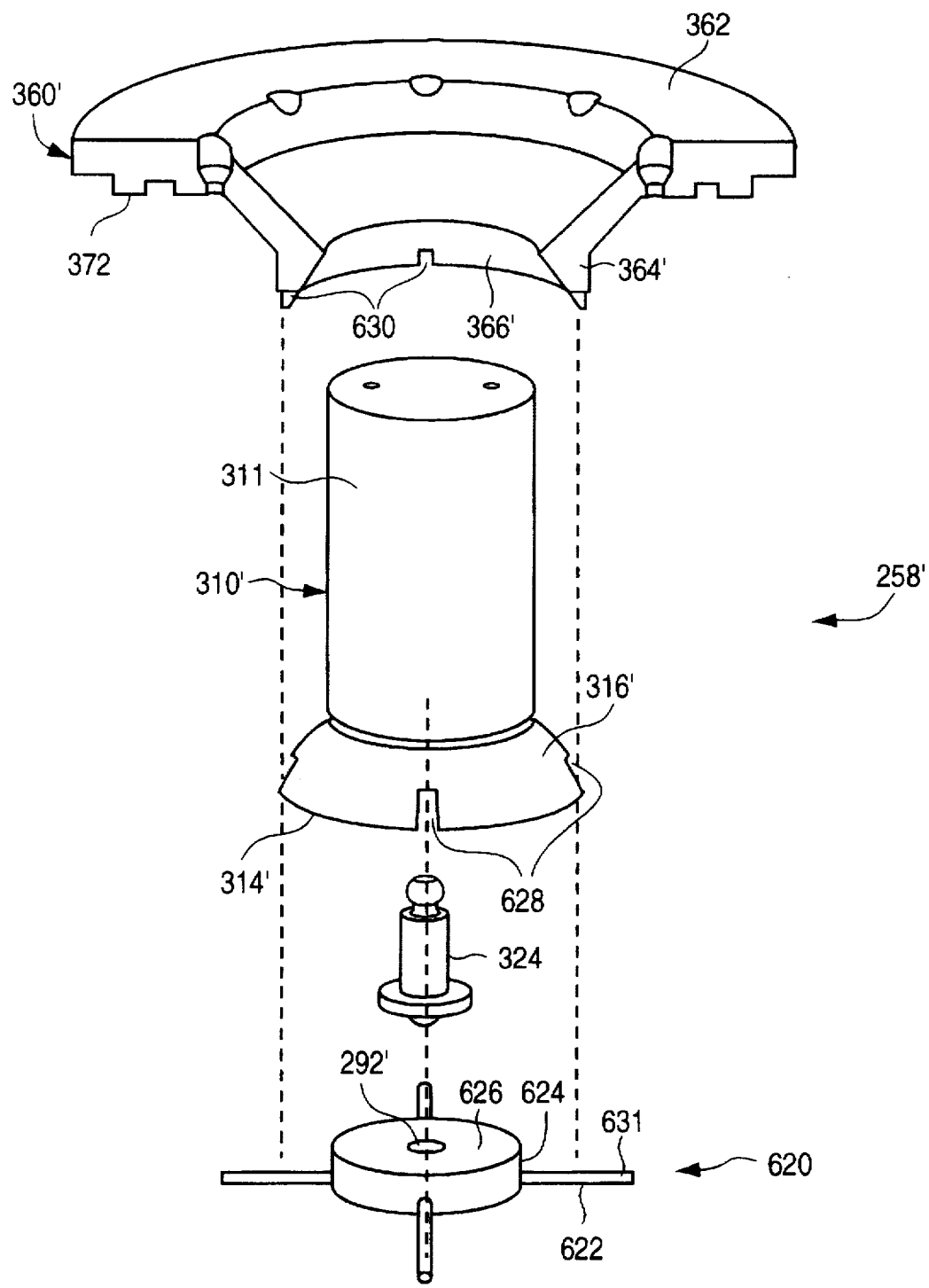
FIG. 18 is an exploded, schematic, and partially cross-sectional view of a gimbal mechanism of a carrier head in accordance with the present invention.

Another embodiment of carrier head 180 is shown in FIGS. 17 and 18. This embodiment changes the configuration of carrier head 180 shown in FIG. 11 in several ways. The connection of diaphragm 460 to housing assembly 252 is altered. The contact between stop ring 540 and ledge 426 is altered. Also, the contact between gimbal mechanism 258 and carrier base 270 through spring 334. The elements of the embodiment shown in FIGS. 17 and 18 which are similar to, but have been modified from, the embodiment shown in FIG. 11 are referred to with primed numerals.

As shown in FIG. 17, diaphragm 460' has a thick outer edge 600, and the upper surface of outer clamp ring 450' has a recess 602. The holes 484' in ledge 426' and the recesses 452' in outer clamp ring 450' are positioned radially outwardly from recess 602. Outer clamp ring 450' is mounted to carrier housing 410' by screws 486 which pass through the holes and engage the recesses. Outer edge 600 fits tightly into recess 602 to seal diaphragm 460' against carrier housing 410' and form pressure chamber 264. The metal to metal contact between outer clamp ring 450' and carrier housing 410' prevents over-compression of diaphragm 460', and thus improves its lifetime and performance.

In the embodiment of FIG. 17, there is direct contact between carrier base 270' and housing assembly 252 to prevent the over-extension of diaphragm 460', instead of a stop ring attached to retaining ring assembly 254 (see FIG. 11). In the configuration of FIG. 17, outer flange 496' and inner flange 494 of piston frame 490' are about the same height; the outer flange does not extend up to ledge 426'. Flange 428', which projects downwardly from the edge of ledge 426' of carrier housing 410', includes an upper ring 610 and a lower ring 612. Lower ring 612 has a smaller radius than upper ring 610, so that upper ring 610 is positioned above outer flange 496' of retaining ring assembly 254, whereas lower ring 612 fits concentrically inside outer flange 496'.

Carrier base 270' has a lip 614 which projects from the edge of ledge 278'. When air is pumped into pressure chamber 264 and carrier base 270' is pushed downwardly, lip 614 catches against a surface 616 on flange 428' to stop the downward motion of the carrier base and prevent over-extension of diaphragm 460'. Flange 428' is not an integral part of carrier housing 410', but is mounted to carrier housing 410' with bolts or screws (not shown). The direct contact between lip 614 and surface 616 reduces the stress on torque pin 256'.

A rubber seal 618 fits over the gap between outer flange 496' and upper ring 610 to seal carrier head 180' from slurry. Seal 618 is shaped like a "headband", with O-rings (not shown) at its top and bottom edges. Seal 618 is flexible and can stretch when retaining ring assembly 254 is moved downwardly with respect to housing assembly 252.

The embodiment shown in FIGS. 17 and 18 also eliminates the contact between spring 334 and carrier base 270' in order to improve the planarity of bottom surface 266. Referring to FIG. 18, the gimbal mechanism 258' includes an X-shaped member 620 which comprises four perpendicular rods 622 projecting from a central cylindrical section 624. The top surface 626 of central cylindrical section 624 has a conical depression 292'. Central cylinder 624 fits into conical depression 320 on the underside of bearing base 314' (see FIG. 17).

Bearing base 314' of gimbal body 310' has four vertical slots 628 for receiving rods 622. Guide pin 324 and spring 334 fit into cylindrical passage 322 (see FIG. 17). X-shaped member 620 is positioned in gimbal mechanism 258' so that the spherical projection 332 on the bottom surface of the guide pin engages conical depression 292' of central cylindrical section 624 and rods 622 extend through slots 628 of the bearing base. The wedge piece 364' of gimbal race 360' includes several notches 630. When gimbal race 360' is positioned on the gimbal mechanism, an end 631 of each rod 622 is attached to each notch 630 on gimbal race 360'. For example, bolts or screws (not shown) may pass through holes (not shown) in the outer surface of wedge-piece 364', and into a threaded recesses in the end of each rod. The entire assembly is then placed into a flat-bottomed depression 632 in the center of carrier base 270'.

Once gimbal mechanism 258' is assembled, spring 334 urges gimbal body 310' upwardly away from X-shaped member 620 so that the spherical outer surface 316' of bearing base 314' is pressed against the spherical inner surface 366' of gimbal race 360'. The gimbal body 310' can still pivot in two dimensions relative to gimbal race 360', because rods 622 can slide in slots 628. However, since X-shaped member 620 is fixed to gimbal race 360', the downward force from spring 334 is not transmitted to carrier base 270'. Since there is no outward pressure on the center of the carrier base, the bottom surface 266 of carrier base 270' remains planar when gimbal mechanism 258' is attached to the carrier base.

Yet another embodiment of carrier head 180, illustrated in FIG. 21, uses vertical pins 700 to transfer torque directly from base assembly 250 to retaining ring assembly 254. The elements of FIG. 21 which are similar to, but have been modified from, the previous embodiments are referred to with double-primed numerals.

As shown in FIG. 21, retaining ring assembly 254 includes retaining ring 510 attached to piston frame 490". Inner flange 494 and outer flange 496" of piston frame 490" are about the same height. An inner surface 702 of outer flange 496" has three evenly spaced-apart semicircular vertical grooves 704 (only two are shown because of the cross-sectional view). An outer surface 706 of flange 300" of carrier base 270" also has three evenly spaced-apart semicircular vertical grooves 708 (again, only two are shown due to the cross-sectional view). Inner flange 494 of retaining ring assembly 254 fits into gap 304 of base assembly 254 and contacts bladder 520. Outer surface 708 of flange 300" engages inner surface 702 of outer flange 496" so that grooves 704 align with grooves 708 to form three vertical cylindrical passages.

Three cylindrical pins 700 fit into the cylindrical passages to transfer torque from base assembly 250 to retaining ring assembly 254. Pins 700 allow base assembly 250 to slide vertically with respect to retaining ring assembly 254. When base assembly 250 rotates about axis 296, pins 700 provide a lateral connection for the base assembly to rotate the retaining ring assembly. In addition, when base assembly 250 pivots with respect to housing assembly 252, pins 700 keep the retaining ring aligned with the base assembly. A stop ring (not shown) may fit over flange 496" to vertically restrain pins 700. The stop ring may have a projection which directly engages housing assembly 252 to stop downward vertical motion of the retaining ring assembly.

Inner surface 702 of outer flange 496" of piston ring 490" may have two opposing rectangular vertical depressions 710 (only one is shown) and flange 428" of housing 410" may have two downwardly-projecting tabs 712 (only one is shown). Each tab 712 has a rectangular slot 562. Tab 712 fits into vertical depression 710 between outer surface 706 of base assembly 250 and inner surface 702 of retaining ring assembly 254. As described above, a slider may fit into rectangular slot 562, and a torque pin may extend through a hole in the slider to connect housing assembly 252 to base assembly 250.

Figure 19A:
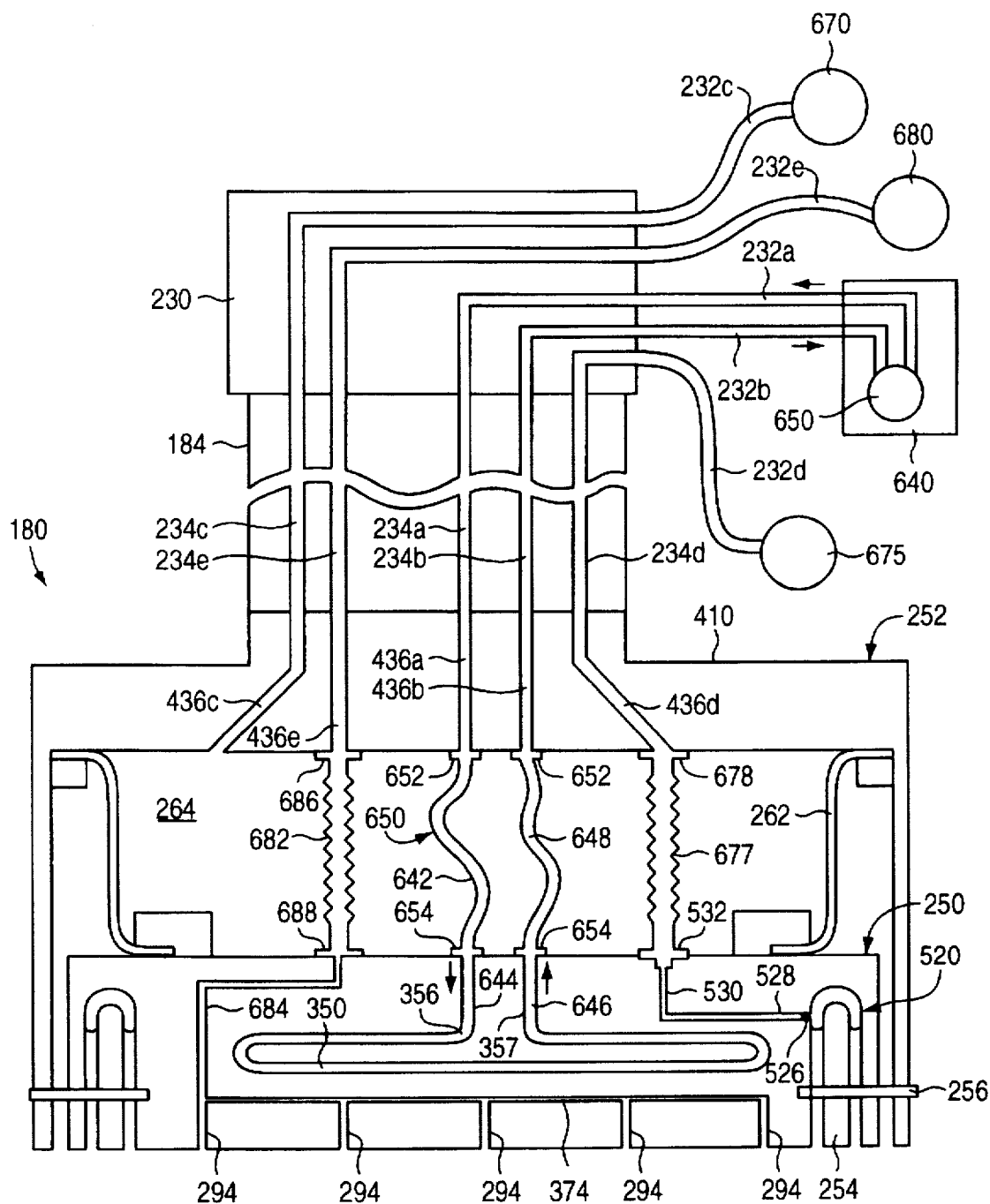
FIG. 19A is a schematic diagram of the fluid lines of the carrier head of the present invention connected to a drive shaft having five or more channels.
Figure 19B:
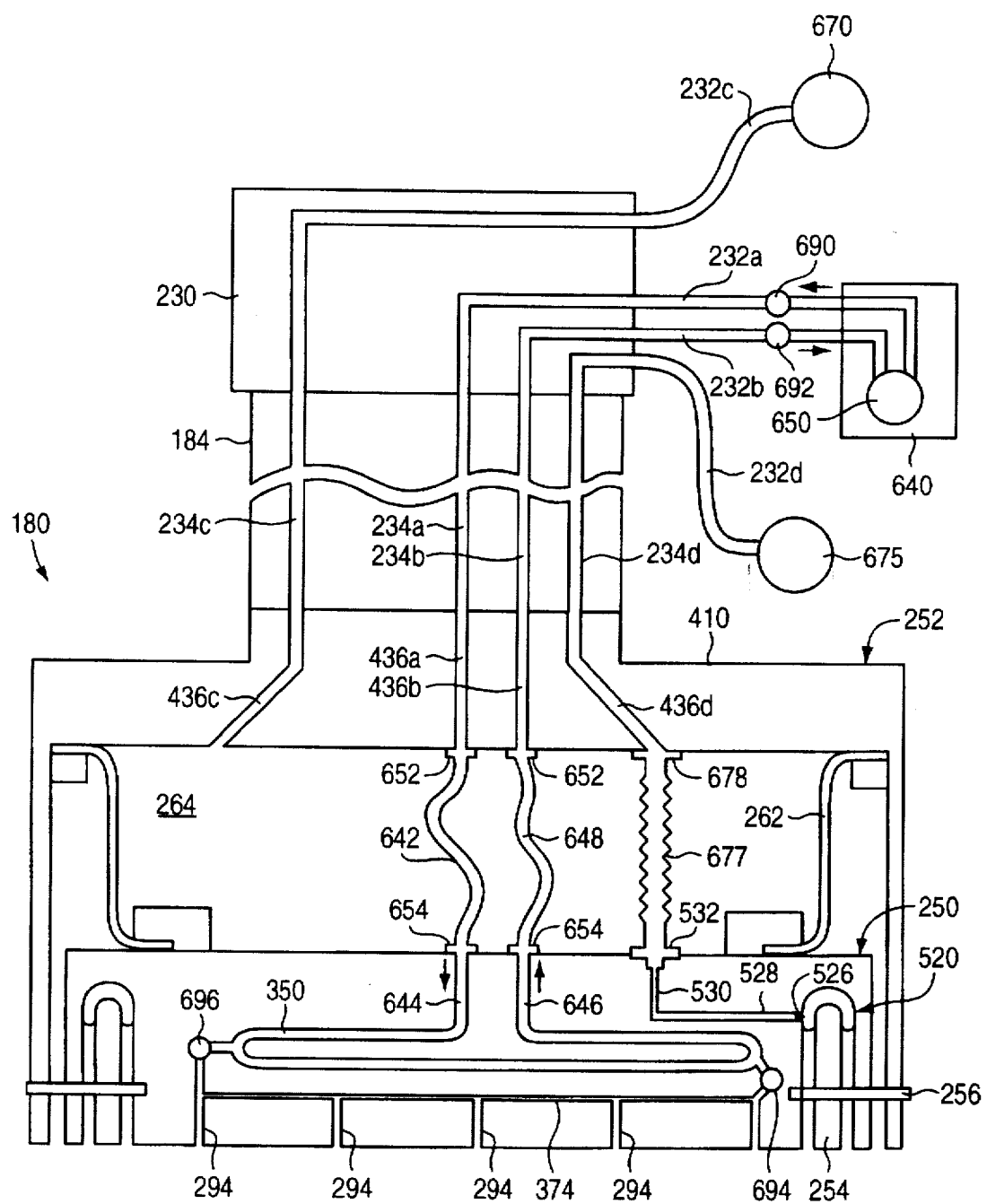
FIG. 19B is a schematic diagram of the fluid lines of the carrier head of the present invention connected to a drive shaft having four channels.

As shown in FIGS. 19A and 19B, the polishing apparatus of the present invention includes several fluid lines which permit fluid, such as air or water, to flow into and out of carrier head 180. As will be described in detail below, these fluid lines may be used to pressurize chamber 264, to actuate retaining ring assembly 252, to control the temperature of carrier head 180, and to vacuum-chuck the substrate to the bottom of the carrier head. In the configuration illustrated by FIG. 19A, the polishing apparatus includes five fluid lines, whereas in the configuration illustrated by FIG. 19B, the polishing apparatus includes four fluid lines.

Some of the fluid lines include connections which permit fluid flow between base assembly 250 and housing assembly 252. Since base assembly 250 and housing assembly 252 move vertically relative to each other, flexible fluid connections are used in pressure chamber 264. These flexible fluid connections link the angular conduits in housing assembly 252 to the various conduits in base assembly 250. The joint between each flexible fluid connection and each conduit is sealed by a fitting to prevent the fluid in the connection from leaking into the pressure chamber. Each flexible fluid connection may be a plastic tubing or a metal bellows.

As mentioned above, some of the fluid lines are used to control the temperature of the carrier head. Because CMP is partially a chemical process, the polishing rates will change depending on the temperature of the substrate. Generally, polishing proceeds more rapidly at higher temperatures. The friction between substrate 10 and polishing pad 120 generates heat. The heat accumulates in the carrier head and the platen. For example, after thirty minutes of polishing, the temperature at the interface between substrate 10 and polishing pad 120 may increase from room temperature of 20° C. to 40°–50° C. Because the temperature of the polishing apparatus increases with the number of substrates that have been polished, each successive substrate placed in the polishing apparatus will be subjected to a different temperature, and therefore a different polishing rate. To achieve consistent polishing, each substrate should be subjected to substantially the same temperature.

Prior polishing systems have attempted to control the temperature of the substrate by controlling the temperature of the platen. Unfortunately, the polishing pad is not an effective conductor of heat, and therefore control of platen temperature does not effectively control the substrate temperature. The polishing system of the present invention solves such problems by controlling the temperature of carrier head 180.

As shown in FIG. 19A, a coolant, such as water or glycol, can be circulated through carrier head 180 by two fluid lines. Specifically, the coolant may flow from a heat exchanger 640, through an inlet line 232a, and then through rotary coupling 230, a channel 234a in drive shaft 184, a conduit 436a in housing assembly 252, and a flexible fluid connector 642 in pressure chamber 264. From flexible fluid connector 642, fluid flows through a connecting conduit 644 and into the inlet 356 of passageway 350 in base assembly 250. The coolant circulates in passageway 350, absorbing heat generated by friction between the substrate the polishing pad. Once the coolant has circulated through this passageway, it exits through outlet 357, travels out an outlet conduit 646 to a flexible fluid connector 648. From there, the coolant flows through a conduit 436b in housing assembly 252, a channel 234b in drive shaft 184, rotary coupling 230, an outlet line 232b, and then back to heat exchanger 640. The heat exchanger can be operated to maintain the temperature of the coolant at a set temperature, such as between 5° and 100° C. The heat exchanger may include a pump 650, such as a positive displacement pump or centrifigual pump, to pump the coolant through the carrier head. In addition, a thermocouple (not shown) may be embedded in base assembly 250 to sense the temperature of carrier head 180.

Figure 20:
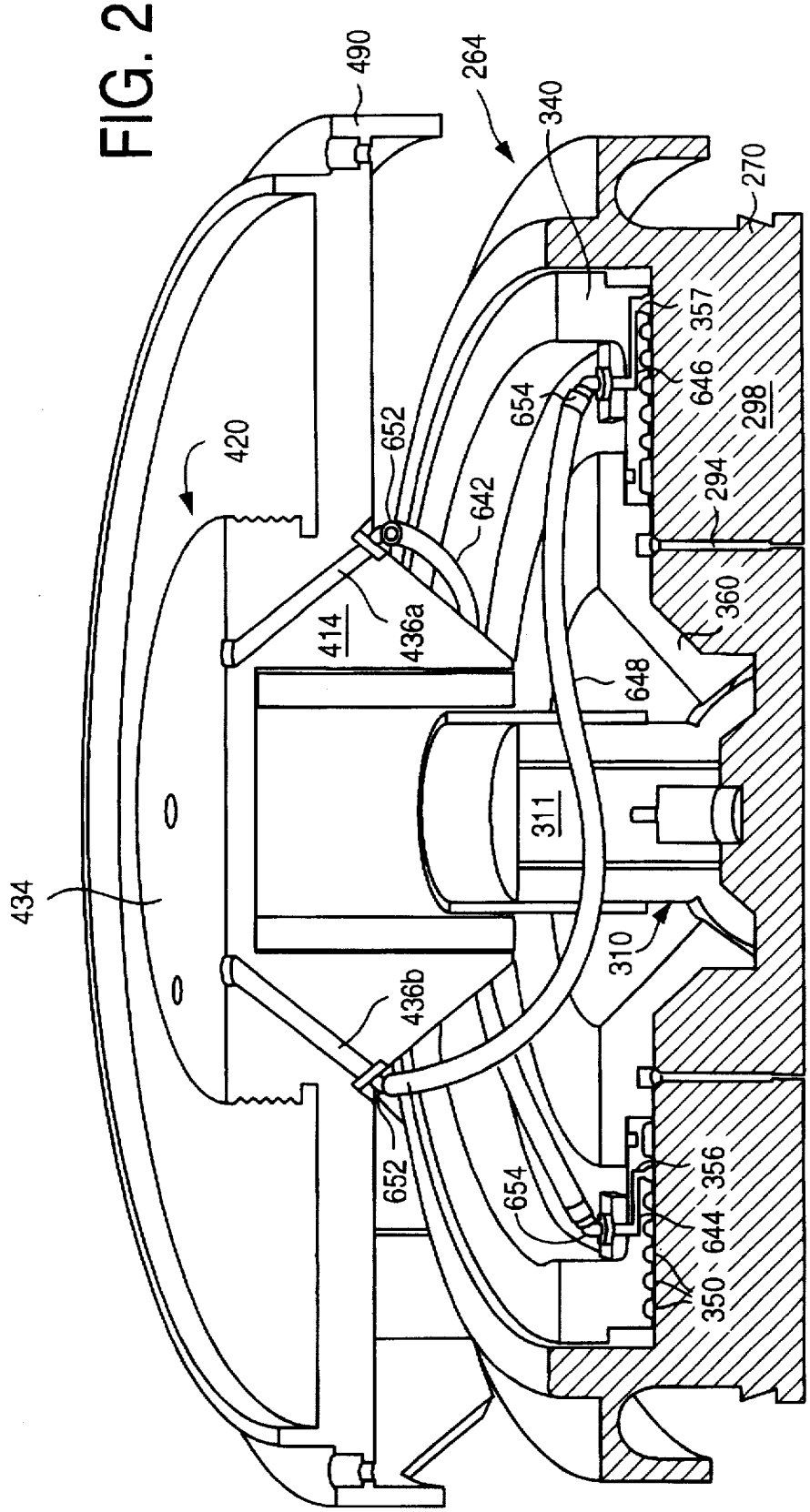
FIG. 20 is an exploded, schematic perspective view of tubing in a pressure chamber for providing a coolant to a carrier head according to the present invention.

In one implementation illustrated by FIG. 20, flexible fluid connectors 642 and 648 are plastic tubing connecting fittings 652 in housing assembly 252 to fittings 654 in base assembly 250. Fittings 652 and 654 seal the joints between the plastic tubing and the conduits to prevent leakage of fluid into chamber 264. The plastic tubing may be wrapped in a half, a three-quarter, or a full turn, or more, around conical hub 414 and gimbal rod 311. When the volume of pressure chamber 264 increases so that the base assembly moves downwardly relative to the housing assembly, the tubing stretches minimally. In another unillustrated implementation, the flexible fluid connectors may be metal bellows. The metal bellows can stretch and contract to match the height of pressure chamber 264. Preferably, the metal bellows a fitting to another fitting that is directly overhead.

This arrangement allows heat to be transferred to the coolant and carried to heat exchanger 640. Since both the carrier base and the carrier film conduct heat effectively, control of the carrier head temperature will provide control of the substrate temperature.

As shown in FIG. 19A and discussed above, another line of the polishing apparatus is used to press the substrate against the polishing pad. A pump 670 forces fluid, preferably air, into and out of pressure chamber 264. Pump 670 is connected via a fluid line 232c, a channel 234c in drive shaft 184, and a conduit 436c in housing assembly 252, to pressure chamber 264. Pump 670 may be a positive displacement pump or a centrifugal displacement pump. When fluid is pumped into pressure chamber 264, the pressure increases to push base assembly 250 downwardly relative to housing assembly 252.

Also, as discussed above, another line of the polishing apparatus is used to actuate the retaining ring assembly. Retaining ring assembly 254 is actuated by inflating bladder 520 with a pump 675. Pump 675 is connected by a line 232d, a channel 234d in drive shaft 184, a conduit 436d in housing assembly 252, a flexible fluid connection 677 through pressure chamber 264, second channel 530 in carrier base 270, first channel in carrier base 270, and valve 526, to bladder 520. Fittings 678 and 532 seal flexible fluid connection 677 to conduit 436d and second channel 530. Flexible fluid connection 677 may be a metal bellows (as shown), or flexible plastic tubing. Pump 680 may force fluid, such as air, into and out of bladder 520 to inflate and deflate the bladder. Since the polishing apparatus uses separate fluid lines for the pressure chamber and the bladder, the polishing apparatus provides an independently controllable load on the retaining ring.

As discussed above, the fluid lines of the polishing apparatus may be used to vacuum-chuck the substrate to the carrier head. However, the implementation of the vacuum-chuck will depend on how many fluid lines are provided by polishing apparatus 80. As shown in FIG. 19A, rotary coupling 230 may provide five or more junctions so that the polishing apparatus may have five fluid lines. In the implementation of FIG. 19A, drive shaft 184 may have five channels 234a–234e and housing assembly 252 may have five conduits 436a–436e.

A pump 680 may apply a vacuum to conduits 294 to chuck substrate 10 to bottom surface 266. Pump 680 may also push substrate 10 off bottom surface 266 by blowing air through conduits 294. Pump 680 is connected via a line 232e, a channel 234e in drive shaft 184, a conduit 436e in housing assembly 252, a flexible fluid connection 682 in pressure chamber 264, a passage 684, and circular passage 374, to conduits 294. Preferably, flexible fluid connection 374, to conduits 294. Preferably, flexible fluid connection 682 is a metal bellows. Two fittings 686 and 688 seal flexible fluid connection to conduit 436e and passage 684. If there is a sixth line (not shown), that line may be used for an electrical connection to a thermocouple.

As shown in FIG. 19B, rotary coupling 230 may provide only four junctions so that the polishing apparatus has only four fluid lines. In the implementation of FIG. 19B, drive shaft 184 has four channels 234a–234d and housing assembly 252 has four corresponding conduits 436a–436d. Carrier head 180 applies a vacuum or forces fluid through conduits 294 by using passageways associated with the cooling system.

As shown in FIG. 19B, several valves are provided to controllably chuck or eject the substrate. An inlet valve 690 connects heat exchanger 640 to inlet line 232a, and an outlet valve 692 connects heat exchanger 640 to outlet line 232b. A first check valve 694 and a second check valve 696 connect passage 374 to passageway 350 of the cooling system. First check valve 694 remains closed when there is fluid in passageway 350 and opens when there is vacuum in passageway 350. Second check valve 696 is spring loaded and remains closed unless the pressure in passageway 350 exceeds a preset pressure.

When the carrier head presses the substrate against the polishing pad, inlet valve 690 and outlet valve 692 are opened, and heat exchanger 640 pumps coolant through passage 350. Because fluid is flowing through passage 350, check valves 694 and 696 remain closed and isolate conduits 294.

However, when the substrate moves between polishing stations, the polishing apparatus may chuck the substrate to bottom surface 266. To chuck the substrate, inlet valve 690 is closed, outlet valve 692 is closed, and pump 650 continues to pump fluid out of passageway 350. Pump 650 reduces the pressure in passageway 350 until first check valve 694 opens to connect conduits 294 to passageway 350. This applies a vacuum to conduits 294 to chuck substrate 10 to bottom surface 266.

When the carrier head is positioned at the transfer station, the polishing apparatus may eject the substrate from bottom surface 266. To eject the substrate, inlet valve 690 is opened, outlet valve 692 is closed, and pump 650 continues to pump fluid into passageway 350. Pump 650 increases the pressure in passageway 350 until it exceeds the countering force from the spring, so that the second check valve 696 opens to connect conduits 294 to passageway 350. Coolant will be forced outwardly through conduits 294, ejecting substrate 10 from the carrier head.

In summary, the carrier head of the present invention uses a pressure chamber and a floating gimbal. The floating gimbal allows the carrier base to pivot with respect to the drive shaft, but no downward force is applied to the substrate through the gimbal. Instead, a rolling diaphragm seals the carrier base to the carrier housing to form a chamber. By pressurizing the chamber, an even load can be applied across the substrate. A retaining ring is independently loaded by an inflatable bladder. Torque is transferred from the carrier housing to the carrier base by two horizontal pins positioned near the substrate. The pins can slide vertically in the housing, but not laterally. However, there is sufficiently elasticity to allow the torque pins to comply with manufacturing tolerances so that both torque pins bear the rotational load. Channels in the bottom of a cooling plate can be connected by flexible fluid connections through the chamber to a heat exchanger to provide temperature control of the carrier head.

The present invention has been described in terms of a preferred embodiment. The invention, however, is not limited to the embodiment depicted and described. Rather, the scope of the invention is defined by the appended claims.

What is claimed is:

1. A carrier head for a chemical mechanical polishing apparatus comprising:

a housing connectable to a drive shaft to rotate with said drive shaft about a first axis;

a base to hold a substrate against a polishing pad, said base connected to said housing to rotate about said first axis;

a loading mechanism to cause said base to press said substrate against said polishing pad; and a gimbal mechanism pivotally and slidably connecting said housing to said base to permit said base to pivot with respect to said housing and to transmit horizontal forces from said base to said housing.

2. The carrier head of claim 1 wherein said gimbal mechanism includes a gimbal rod which slides along said first axis in a passage in said housing, and a gap separates said gimbal rod from a ceiling of said passage.

3. The carrier head of claim 1 wherein said base pivots about a second axis substantially perpendicular to said first axis.

4. The carrier head of claim 3 wherein said base rotates with respect to said housing about a point at an interface between said substrate and said polishing pad.

5. The carrier head of claim 4 wherein said point is located along said first axis.

6. The carrier head of claim 1 wherein said loading mechanism includes a flexible seal connecting said base to said housing to form a chamber therebetween.

7. The carrier head of claim 6 wherein said gimbal mechanism comprises a gimbal race connected to said base, said gimbal race having a spherical inner surface, a gimbal rod which slides along said first axis in a passage in said housing, a gap separating said gimbal rod from a ceiling of said passage, and a bearing connected to said gimbal rod, said bearing having a spherical outer surface engaging said inner surface of said gimbal race.

8. The carrier head of claim 7 further comprising a spring for forcing said outer surface of said bearing against said inner surface of said gimbal race.

9. The carrier head of claim 8 further comprising a rigid member connected to said gimbal race, said member positioned between said bearing and said base, said spring applying a force to push said bearing away from said member.

10. A carrier head for a chemical mechanical polishing apparatus comprising:

a housing connectable to a drive shaft to rotate with said drive shaft about a first axis;

a base to hold a substrate against a polishing pad, said base connected to said housing to rotate about said first axis;

a loading mechanism to cause said base to press said substrate against said polishing pad;

a rod positioned in a passage along said first axis in said housing, said rod connected to said base to transmit horizontal forces from said base to said housing; and a gap separating said rod from a ceiling of said passage.

11. The carrier head of claim 10 further comprising linear bearing surrounding said gimbal rod in said passage to transfer said horizontal forces from said base to said housing.

12. A carrier head for a chemical mechanical polishing apparatus comprising:

a housing connectable to a drive shaft to rotate with said drive shaft about a first axis;

a base to hold a substrate against a polishing pad;

a loading mechanism to cause said base to press said substrate against said polishing pad; and a substantially horizontal pin connecting said base to said housing so said base rotates about said first axis.

13. The carrier head of claim 12 wherein said housing includes a vertically elongated aperture and said pin extends from said base through said elongated aperture.

14. The carrier head of claim 13 further comprising a slider positioned in said elongated aperture, said pin extending through a hole in said slider, and said slider being substantially free to move vertically in said aperture but substantially restrained from moving laterally.

15. The carrier head of claim 12 further comprising a second substantially horizontal pin connecting said base to said housing.

16. A carrier head for a chemical mechanical polishing apparatus comprising:

a housing connectable to a drive shaft to rotate with said drive shaft;

a base to hold a substrate against a polishing pad, said base comprising a body and a first annular flange projecting downwardly from an outer edge of said body, a gap separating said first flange from said body;

a loading mechanism to cause said base to press said substrate against said polishing pad;

a retaining ring assembly having a second annular flange positioned in said gap; and an annular U-shaped bladder disposed in said gap between said flange and said base.

17. The carrier head of claim 16 wherein said loading mechanism includes a flexible seal connecting said base to said housing to form a chamber therebetween.

18. The carrier head of claim 17 further comprising a flexible fluid connection through said chamber linking a passage in said housing to said U-shaped bladder.

19. A carrier head for a chemical mechanical polishing apparatus comprising:

a housing connectable to a drive shaft;

a base to hold a substrate against a polishing pad, said base connected to said housing;

a pressure chamber to cause said base to load said substrate against said polishing pad; and a gimbal pivotally and slidably connecting said housing to said base to permit said base to pivot with respect to said housing and to transmit horizontal forces from said base to said housing.

20. The carrier head of claim 19 wherein said base is connected to said housing such that substantially no downward force is applied to said base through said gimbal.

21. The carrier head of claim 19 further comprising a substantially horizontal member to transmit torque from said housing to said base.

22. A carrier head for a chemical mechanical polishing apparatus comprising:

a housing connectable to a drive shaft to rotate with said drive shaft about a first axis;

a base to hold a substrate against a polishing pad;

a pressure chamber to cause said base to load said substrate against said polishing pad; and a substantially horizontal member connecting said base to said housing so said base rotates about said first axis.

23. A carrier head for a chemical mechanical polishing apparatus comprising:

a housing connectable to a drive shaft;

a base to hold a substrate against a polishing pad, said base pivotally connected to said housing;

a loading mechanism to cause said base to press said substrate against said polishing pad;

a gimbal race coupled to said base, said gimbal race having a spherical inner surface;

a bearing coupled to said housing, said bearing having a spherical outer surface to engage the inner surface of said gimbal race;

a member positioned beneath said bearing and fixed to said gimbal race; and a spring positioned between said member and said bearing to force the outer surface of the bearing against the inner surface of said gimbal race.

* * * * *

UNITED STATES PATENT AND TRADEMARK OFFICE
CERTIFICATE OF CORRECTION

PATENT NO. : 5,762,544
DATED : 6/9/98
INVENTOR(S) : Zuniga et al.

It is certified that error appears in the above-identified patent and that said Letters Patent is hereby corrected as shown below:

Cover Page, after "[22] Filed: Apr. 24, 1996" insert
--Related U.S. Application Data
[62] Continuation of Ser. No. 549,474, October 27, 1995, abandoned.--

Column 1, line 5, before "This application" insert
--This is a continuation of application Serial No. 08/549,474, filed on October 27, 1995, now abandoned.--

Signed and Sealed this

Seventeenth Day of August, 1999

Attest:

Q. TODD DICKINSON

*Attesting Officer*   *Acting Commissioner of Patents and Trademarks*